United States Patent [19]

Hayashi et al.

[11] Patent Number: 5,001,775
[45] Date of Patent: Mar. 19, 1991

[54] AM/FM RECEIVER WITH INSERTABLE MEMORY CARD AND DISPLAY OF FREQUENCIES AND RESPECTIVE GEOGRAPHIC REGIONS

[75] Inventors: Eriko Hayashi; Tadashi Sakai; Fumio Noda, all of Kanagawa, Japan

[73] Assignee: Sony Corporation, Tokyo, Japan

[21] Appl. No.: 406,057

[22] Filed: Sep. 12, 1989

[30] Foreign Application Priority Data

Sep. 13, 1988 [JP] Japan .................................. 63-229480
May 8, 1989 [JP] Japan .................................. 1-114676

[51] Int. Cl.⁵ .............................................. H04B 1/08
[52] U.S. Cl. ..................................... 455/158; 455/186; 455/347
[58] Field of Search ............... 455/154, 158, 186, 349, 455/347, 183; 358/254

[56] References Cited

U.S. PATENT DOCUMENTS 3,187,713 6/1965 Fenwick ............................. 455/157
4,306,294 12/1981 Hoshimoto et al. ................ 455/158
4,888,815 12/1989 Ahlemeyer et al. ................ 455/168

FOREIGN PATENT DOCUMENTS 0068036 3/1989 Japan ................................. 455/158

OTHER PUBLICATIONS

David M. Thomas, Radio Electronic, May 1973, pp. 42–45, 50 and 93.

Primary Examiner—Reinhard J. Eisenzopf
Assistant Examiner—Lisa Charouel
Attorney, Agent, or Firm—Alvin Sinderbrand; William S. Frommer

[57] ABSTRACT

A radio receiver having a synthesizer-type receiving circuit, in which the received broadcast signal is determined by varying a frequency-dividing ratio in a phase-locked loop, is provided with a display which shows in respective areas of a tabular format the names of various geographic regions and of station that can be received in the respective geographic regions, and with a memory having addresses for storing data corresponding to frequencies needed for the reception of respective broadcasting stations receivable in the various geographic regions. A signal forming circuit, for example, responsive to coded information on the display, provides signals indicating respective geographic regions whose names are selectively displayed, and channel-selection switches, which are desirably positionally related to respective areas of the tabular format of the display, are selectively actuable for cooperation with the signals from the signal forming circuit in causing a microcomputer to read data stored at respective addresses of the memory and to determine the frequency-dividing ratio from such data.

16 Claims, 13 Drawing Sheets

FIG. 5

| Card | Area RGNm / Mark 11 | (11D) ~ (11A) | | | |
|---|---|---|---|---|---|
| (10A) | 1. Hokkaido Area | 0 | 0 | 0 | 1 |
| | 2. Tohoku Area 1 | 0 | 0 | 1 | 0 |
| (10B) | 3. Tohoku Area 2 | 0 | 0 | 1 | 1 |
| | 4. Kanto Area | 0 | 1 | 0 | 0 |
| ... | ...... | . | . | . | . |
| (10F) | 11. Kyushu Area 1 | 1 | 0 | 1 | 1 |
| | 12. Kyushu Area 2 | 1 | 1 | 0 | 0 |
| (10G) | 13. AM Free | 1 | 1 | 0 | 1 |
| | 14. FM Free | 1 | 1 | 1 | 0 |

FIG. 10

| Less Significant Address n (Station No) / More Significant Address m (Area Name) | 1H | 2H | 3H | ... | AH |
|---|---|---|---|---|---|
| 1H (Hokkaido Area) | 113 (NHK Sapporo Radio 1, 567 kHz) | 115 (NHK Kushiro Radio 1, 585 kHz) | 123 (NHK Obihiro Radio 1, 657 kHz) | ... | 210 (STV Radio Broadcasting, 1440 kHz) |
| 2H (Tohoku Area 1) | 109 (NHK Morioka Radio 1, 531 kHz) | ... | ... | ... | 219 (NHK Aomori Radio 2, 1521 kHz) |
| 3H (Tohoku Area 2) | 110 (NHK Yamagata Radio 1, 540 kHz) | ... | ... | | 228 (NHK Fukushima Radio 2, 1602 kHz) |
| 4H (Kanto Area) | 116 (NHK Tokyo Radio 1, 594 kHz) | 127 (NHK Tokyo Radio 2, 693 kHz) | 135 (Yamanashi Broadcasting, 765 kHz) | | 220 (Tochigi Broadcasting, 1530 kHz) |
| ... | | | | | ...... |
| CH (Kyushu Area 2) | 110 (NHK Miyazaki Radio 1, 540 kHz) | | | ... | 204 (NHK Kagoshima Radio 2, 1386 kHz) |

FIG. 11A

| More Significant Address m (Name of Card) \ Less Significant Address n | 1H | 2H | 3H | ... | 7H |
|---|---|---|---|---|---|
| DH (AM Free Card) | Na1 | Na2 | Na3 | ... | Na7 |
| EH (FM Free Card) | Nf1 | Nf2 | Nf3 | ... | Nf7 |

FIG. 11B

| Address m (Name of Area) | 1H (Hokkaido Area) | 2H (Tohoku Area 1) | 3H (Tohoku Area 2) | 4H (Kanto Area) | ... | CH (Kyushu Area 2) | DH (AM Free) | EH (FM Free) |
|---|---|---|---|---|---|---|---|---|
| Data Lm | L1 | L2 | L3 | L4 | ... | L12 | L13 | L14 |

FIG. 11C

| Address | F1H | F2H | F3H |
|---|---|---|---|
| Data | Receiving Band AF | La | Lf |

| Na | 109 | 110 | - - - - - - - - | 229 |
|---|---|---|---|---|
| fo | 981 kHz | 990 kHz | - - - - - - - - | 2061 kHz |
| fa | 531 kHz | 540 kHz | - - - - - - - - | 1611 kHz |

| Nf | 653 | 654 | - - - - - - - | 793 |
|---|---|---|---|---|
| fo | 65.3 MHz | 65.4 MHz | - - - - - - - | 79.3 MHz |
| ff | 76.0 MHz | 76.1 MHz | - - - - - - - | 90.0 MHz |

AM/FM RECEIVER WITH INSERTABLE MEMORY CARD AND DISPLAY OF FREQUENCIES AND RESPECTIVE GEOGRAPHIC REGIONS

BACKGROUND OF THE INVENTION

1. Field of the Invention

The present invention relates generally to radio receivers and, more particularly, is directed to a synthesizer-type radio receiver with which the user can select a desired broadcasting station merely by depressing a push-button assigned thereto without prior knowledge of the frequency assigned to such broadcasting station.

2. Description of the Prior Art

Synthesizer-type radio receivers generally require a presetting operation in which the receiver is manually tuned to the known frequency, for example, 549 kHz, of a broadcasting the station desired to be preset and, with the receiver tuned to that known frequency, a push-button or key identified by a respective numeral, such as, the numeral [1], is depressed while simultaneously depressing or otherwise actuating a push-button or key identified as a MEMORY KEY, so that data representing the frequency (594 kHz) to which the receiver is then tuned is written at an address of the memory corresponding to the depressed push-button [1]. After such presetting operation the receiver is automatically tuned to the preset frequency, for example, to 594 kHz, whenever the push-button [1]is depressed.

However, in order to perform the above described presetting operation, the user of the radio receiver has to remember the names and assigned frequencies of the broadcasting stations that can be received in the geographic region where the user is located. Even if the user remembers the names or call letters of the broadcasting stations that can be received in such geographic region, and from which the stations to be preset may be selected, it is unlikely that the user will know or remember the assigned frequencies of the broadcasting stations that are to be preset. Although the assigned frequencies of the broadcasting stations that can be received in a particular geographic region may be learned from the radio program listings in newspapers published in such region, it is very cumbersome and time consuming for the user to preset the frequencies of all of the desired broadcasting stations in accordance with the previously described known procedure.

OBJECTS AND SUMMARY OF THE INVENTION

Accordingly, it is an object of the present invention to provide an improved synthesizer-type radio receiver which overcomes the above described problems associated with the prior art.

More specifically, it is an object of the present invention to provide a synthesizer-type radio receiver which, in a channel-selection mode, permits a desired broadcasting station known by its name or call letters to be selected in a one-touch manner without any knowledge of the assigned frequency of such broadcasting station.

According to an aspect of the present invention, a radio receiver comprises a synthesizer-type receiving circuit which includes a phase-locked loop providing an oscillation signal of a frequency determined by a frequency-divider, and a frequency-converter for selecting a broadcast signal to be received on the basis of the frequency of the oscillation signal; display means for selectively displaying in respective areas of a tabular format the names of various geographic regions and the names of broadcasting stations that can be received in the respective geographic regions; memory means having addresses for storing respective data corresponding to frequencies required for the reception of the broadcasting stations that can be received in the various geographic regions; signal forming means operative in cooperation with the display means for providing signals indicative of respective geographic regions whose names are selectively displayed by the display means; a plurality of actuable channel-selection switch means each corresponding to a respective area of the tabular format in which the display means displays a name of a broadcasting station that can be received in the respective geographic region; and control means, such as a microcomputer, operative in a channel-selection mode to read from the memory means data stored at addresses thereof determined in response to the signals indicative of the geographic regions and selective actuation of the channel-selection switch means, and including means determining the frequency-dividing ratio in response to the data read from the memory means.

In one embodiment of the invention, a casing of the radio receiver has a transparent window and a slot providing access to the interior of the casing in back of the window, and the display means includes at least one card member selectively insertable in the casing through the slot and having a surface visible through the window and which is divided into the areas of the tabular format which are imprinted with the names of a respective geographic region and of the broadcasting stations that can be received in the respective geographic region.

It is a particular feature of this invention to arrange the manually actuable channel-selection switch means so that they are positionally related to the areas at which the display means display the names of the broadcasting stations that can be received in the respective geographic region. For example, in the case where the display means is constituted by at least one card member selectively insertable in the casing through a slot so as to be visible through the window, the actuable channel-selection switch means are pressure-sensitive and incorporated in the window structure at areas thereof corresponding to the divided areas of the card member imprinted with the names of the broadcasting stations so that, upon depressing one of such areas of the window structure, the one of the channel-selection switch means incorporated in such area of the window structure is actuated to cause reception of the broadcasting station named at the underlying area of the card member.

In another embodiment of this invention, the casing of the radio receiver has a transparent elongated window, and the display means includes a cylindrical display member rotatable in the casing about a central axis parallel to the length of the elongated window so that circumferentially successive sections of the peripheral surface of the cylindrical display member are visible through the window upon turning of the display member, with each of the sections of the peripheral surface having imprinted thereon the name of a respective geographic region and being divided in the direction along the section into successive areas imprinted with the names of the broadcasting stations that can be received in the respective geographic region. In the foregoing embodiment, the areas into which each of the sections of the peripheral surface of the cylindrical display member are divided are further identified by respective numerals imprinted thereon, and the channel-selection switch means include pushbutton switches extending in a row from the casing preferably adjacent the elongated window and being identified by respective numerals corresponding to the numerals imprinted on the divided area of each section of the peripheral surface of the cylindrical display member.

The above, and other objects, features and advantages of the present invention, will be apparent in the following detailed description of preferred embodiments when read in connection with the accompanying drawings, in which the same reference numerals identify the same or corresponding parts in the several views.

BRIEF DESCRIPTION OF THE DRAWINGS

FIG. 5 is a table to which reference will be made in explaining various types of display card members that can be used in connection with the synthesizer-type radio receiver of FIGS. 1-4, and which shows the identifying printed information and coded markings applied to the several display card members at the opposite sides thereof;

FIG. 10 is a schematic representation of a data table written in a read only memory (ROM) of a synthesizer-type radio receiver embodying the present invention;

FIGS. 11A, 11B and 11C are schematic representations of contents or data written in a random access memory (RAM), and to which reference will be made in explaining the operation of the synthesizer-type radio receiver according to the present invention;

DETAILED DESCRIPTION OF PREFERRED EMBODIMENTS

Figure 1:
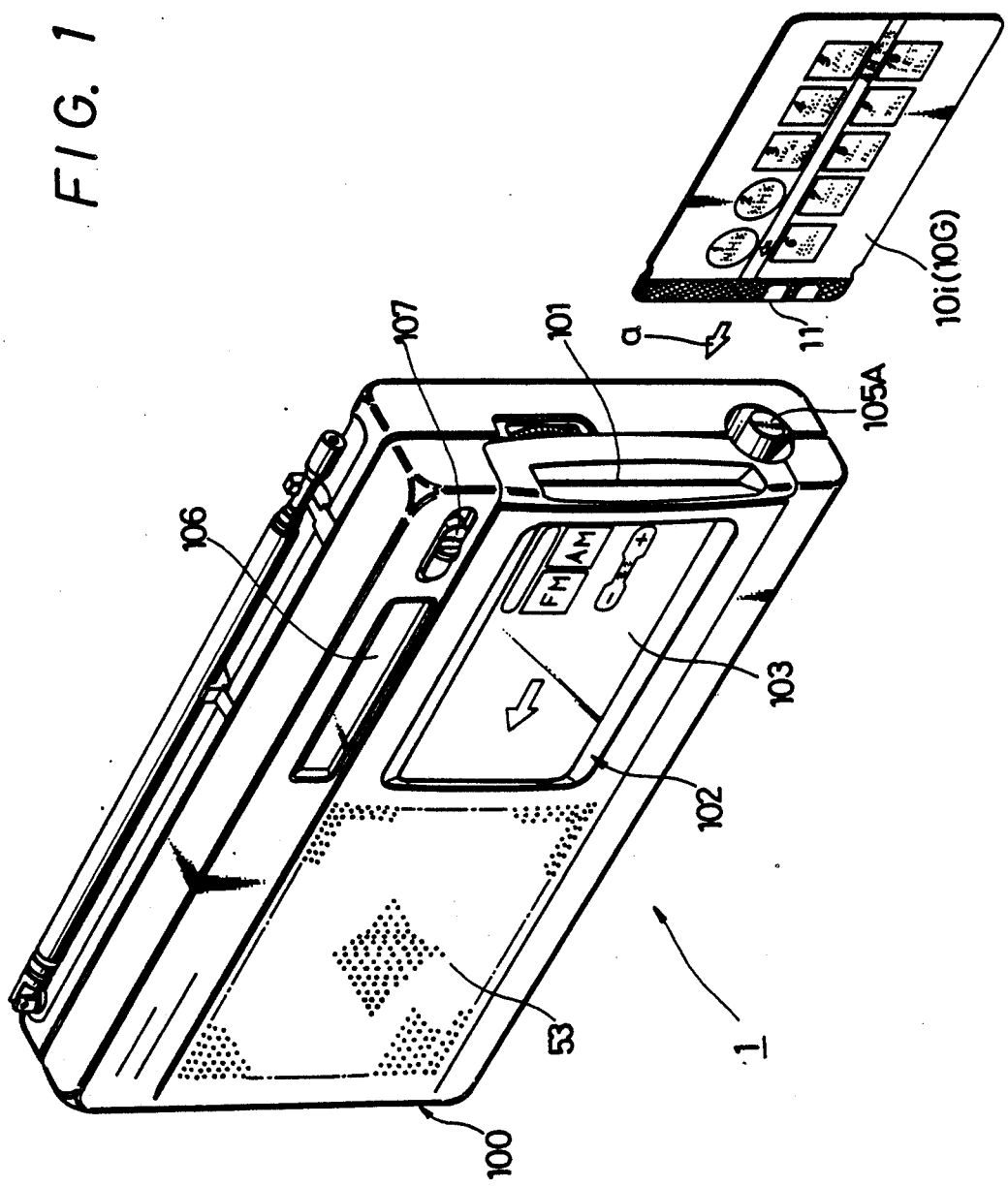
FIG. 1 is a perspective view of a synthesizer-type radio receiver according to an embodiment of the present invention, and which is shown with a display card member separate from a casing of the radio receiver.

Referring to the drawings in detail, and initially to FIG. 1 thereof, it will be seen that a synthesizer-type radio receiver 1 according to an embodiment of this invention generally comprises a receiver casing 100 and one or more display members 10i–10G shown in the form of a card member and being selectively insertable through a slot 101 into the casing 100 which is provided with a rectangular window 102 at the front of the casing for making visible the forwardly facing surface of the inserted display card member.

Each display card member 10i intended for use as part of the radio receiver 1 is desirable made of a plastic material and is rectangular in shape with a size similar to that of a conventional credit card. Each card member 10i is intended to be inserted in the slot 101 in the elongated direction of the rectangular card member, for example, as indicated by the arrow a on FIG. 1. Further, the relatively short side of each display card member at the leading end of the latter, considered in the direction of its insertion into slot 101, is provided with coded identifying information 11. Such coded information identifies, for example, a geographic region for which the respective surface of the display card member is intended. The coded identifying information is shown, by way of example, to be comprised of four marks 11A, 11B, 11C and 11D (FIGS. 2 and 3) printed at spaced locations along the relatively short side of the card member which is at the leading end of the latter as inserted into the casing 100, and which are either white or black so as to represent the binary coded values [1] and [0], respectively. Assuming that the mark 11D represents the most significant bit (MSB), it will be seen that the marks 11A–11D can indicate any one of m numbers identifying respective geographic regions RGNm for which the radio receiver 1 may be used.

Such use of the radio receiver 1 will be described hereinafter with reference to the reception of amplitude modulated (AM) broadcasting stations that can be received in various regions of Japan for which suitable display card members 10i are provided. However, it will be appreciated that the radio receiver 1 can be similarly used in the United States or elsewhere in the world by suitably adapting display card members to respective regions.

Figure 2:
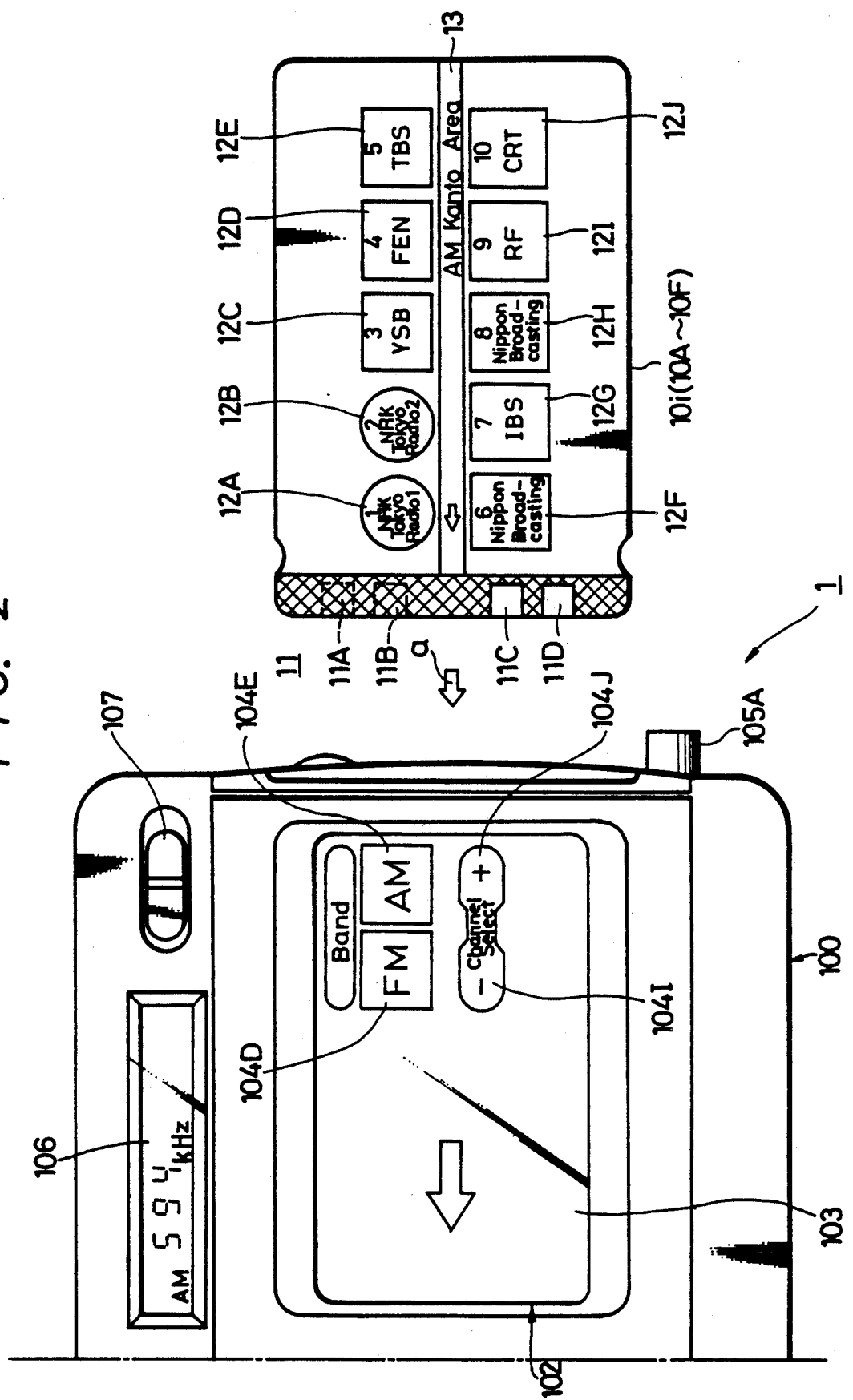
FIG. 2 is front elevational view of a portion of the synthesizer-type radio receiver and display card member shown on FIG. 1.

As shown specifically on FIG. 2, each of the display card members 10A–10F which are collectively identified as display card members 10i has, on each of its surfaces, ten areas 12A–12J in a tabular arrangement or format, and in which there are printed the names of respective broadcasting stations or the like which can be received in the respective one of the geographic regions RGNm identified by the respective coded information 11. Further, there is printed in an area 13 the name of the geographic region, for example, "KANTO AREA" identified by the coded information 11, and also whether the broadcasting stations named on the respective surface of the display card member 10i provide AM or FM transmissions.

The coded information 11, areas 12A–12J having the names of broadcasting stations printed thereon, and the area 13 at which there is printed the name of a geographic region appear on each of the surfaces of each display card member 10i. However, in the embodiment of the present invention being now described, the coded information 11 provided on each of the surfaces of the display card member 10i identifies the geographic region which is named on the opposite surface of the same card member. Thus, for example, if the card member 10i is inserted into the slot 101 of the casing 100 with the legend "KANTO AREA" printed in the area 13 of the forwardly facing surface of the card member, and with the names of the broadcasting stations that can be received in the "KANTO AREA" being printed in the areas 12A–12J on the forwardly facing surface of the card member 10i, then the coded information 11 which identifies the "KANTO AREA" is printed on the rearwardly facing surface of the card member, that is, on the surface which is opposite to that on which the name of the respective geographic region is printed.

Figure 3:
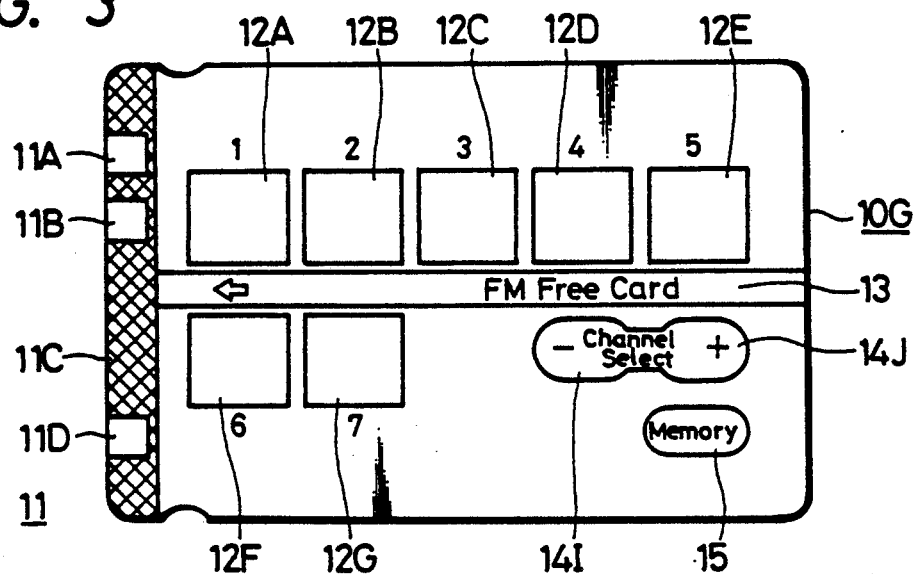
FIG. 3 is a front elevational view of another kind of display card member that can be used in the radio receiver of FIGS. 1 and 2.
Figure 4:
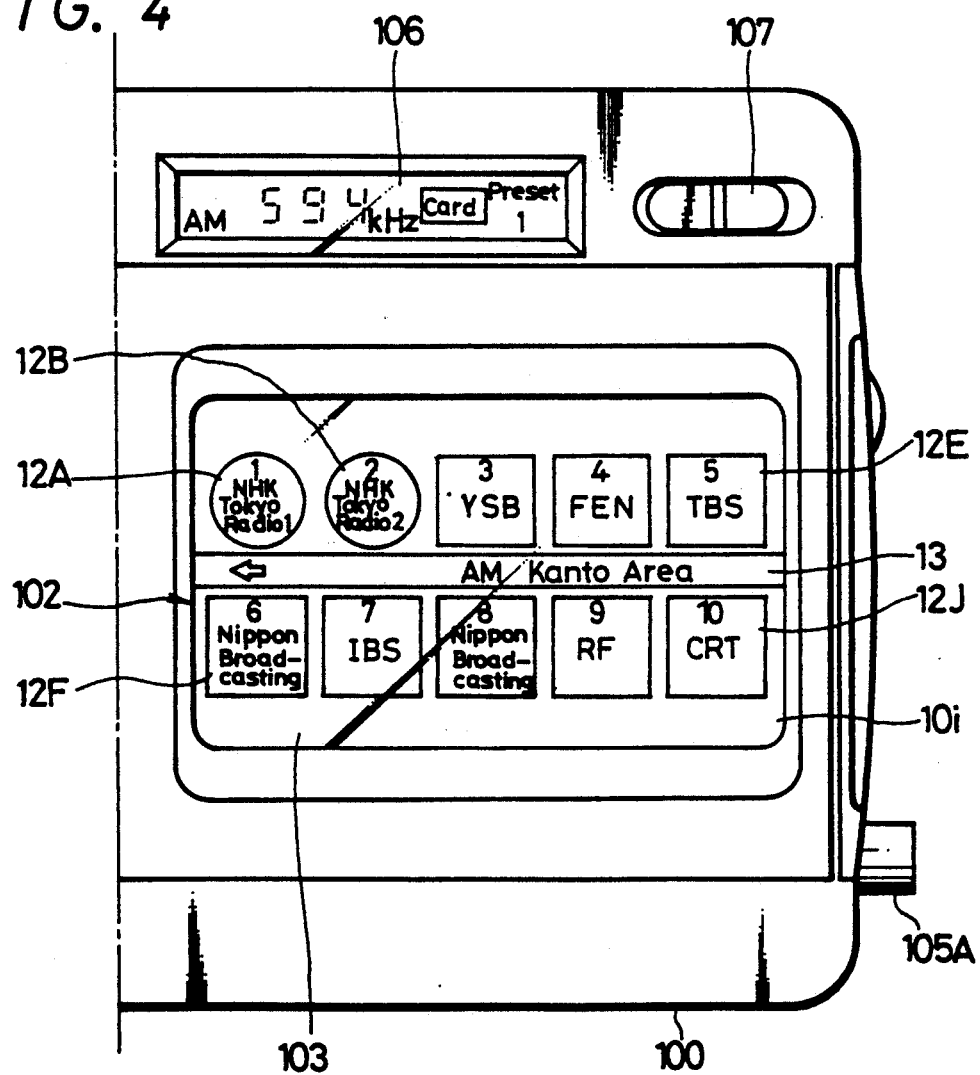
FIG. 4 is a front elevational view similar to that of FIG. 2, but showing the display card member inserted in the casing of the radio receiver.

Referring now to FIG. 3, it will be seen that, in addition to the display card members 10A–10F which specify and are intended for use in receiving broadcasting stations in particular geographic regions, a so-called free card member 10G, which specifies no particular geographic region, may be used in the synthesizer-type radio receiver 1 embodying this invention. In the case of the free card member 10G, such card member is inserted in the slot 101 with one surface facing forwardly for the reception of AM broadcasting stations, and the card member 10G is inserted with its other surface facing forwardly when the radio receiver is to be used for the reception of FM broadcasting stations. In the case of the free card member 10G, each of the surfaces is provided with respective coded information 11 at the leading relatively short end thereof and with areas 12A to 12G and 13 which are situated similarly to the areas identified by the corresponding reference numerals on the card member 10i of FIG. 2. However, in the case of the free card member 10G, the area 13 is imprinted with the legend "FM FREE CARD" or "AM FREE CARD" in accordance with the surface of the card on which such area 13 appears. Further, in the case of the free card member 10G, the areas 12A–12G are blank and are intended to have written therein by the user the names or call letters of the broadcasting stations or the like which are preset, as hereinafter described.

Further, as shown on FIG. 3, symbols [−] and [+] are printed on each surface of the display card member 10G at areas 14I and 14J thereof corresponding to the areas 12I and 12J, respectively, on each card member 10i, and are used to indicate the decrease and increase, respectively, of the receiving frequency when manually presetting such frequency, as hereinafter described in detail. An area 15 is formed under the area 14J on each surface of the card member 10G and the legend [MEMORY] is printed in such area 15 for use when the manually preset receiving frequency is to be stored or written in the memory during a presetting operation.

Figure 6A:
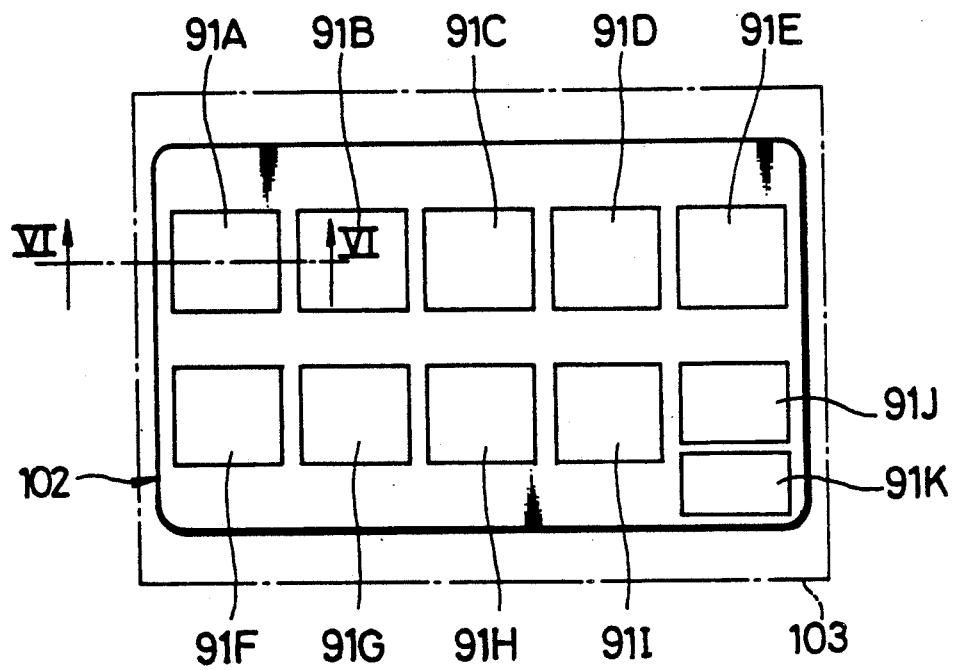
FIG. 6A is a front elevational view of a window structure provided at the front of the casing of the radio receiver of FIGS. 1, 2 and 4 and which incorporates an array of manually actuable pressure-sensitive switches.
Figure 6B:
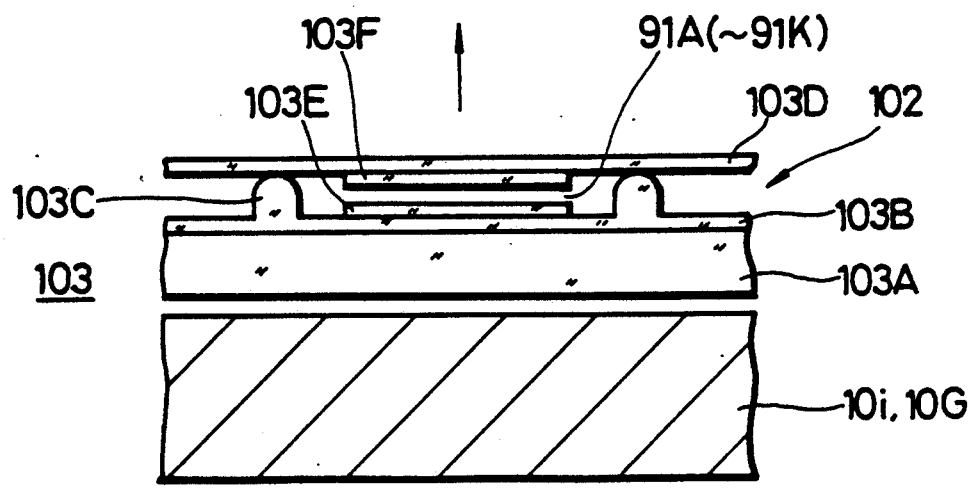
FIG. 6B is an enlarged sectional view taken along the line VI—VI on FIG. 6A for showing details of one of the pressure-sensitive switches.

The rectangular window 102 provided in the front wall of the receiver casing 100 is slightly smaller than the card 10i or 10G to be inserted through the slot 101, and a transparent touch panel 103 extends across the window 102 and will be described in detail with reference to FIGS. 6A and 6B. As shown particularly in FIG. 6B, the transparent touch panel 103 includes a transparent plastic base plate 103A on which there is formed a transparent plastic sheet 103B formed, on its forwardly directed surface, with spacing ridges 103C which divide the transparent touch panel or structure 103 into areas which are to have incorporated therein respective pressure-sensitive switches 91A–91K. A transparent resilient or elastic plastic sheet 103D is provided in front of the sheet 103B and spaced from the latter by the spacing ridges 103C. Transparent electrodes 103E and 103F are provided on the confronting surfaces of the sheets 103B and 103D, respectively, between the spacing ridges 103C to form the normally spaced apart electrodes or contacts of each of the pressure-sensitive switches 91A–91K. The transparent electrodes 103E and 103F of the pressure-sensitive switches 91A–91K are arranged in a suitable pattern, for example, as shown on FIG. 6A, so that, when a card member 10i is inserted through the slot 101 to be situated in back of the window 102, the pressure-sensitive switches 91A–91J are located at the positions of the areas 12A–12J, respectively. Similarly, when a so-called free card member 10G is inserted so as to be situated in back of the window 102, the pressure-sensitive switches 91A–91G are located at the positions of the areas 12A–12G, and the pressure-sensitive switches 91I, 91J and 91K are located at the positions of the areas 14I, 14J and 15, respectively.

As shown particularly on FIG. 2, and as is visible through the window 102 when neither a card member 10i nor a card member 10G is inserted, a wall surface of the receiver casing 100 spaced rearwardly from the transparent touch panel 103 to accommodate a card member 10i or 10G therebetween has areas 104D and 104E located in back of the pressure-sensitive switches 91D and 91E, respectively, and on which are printed the legends "FM" and "AM" for use as hereinafter described in detail. Such casing wall surface in back of the transparent touch panel 103 further has areas 104I and 104J located in back of the pressure-sensitive switches 91I and 91J, respectively, and on which there are printed the symbols [−] and [+] for indicating the decreasing and increasing of the receiving frequency during a manual operation, as also hereinafter described in detail.

Figure 7A:
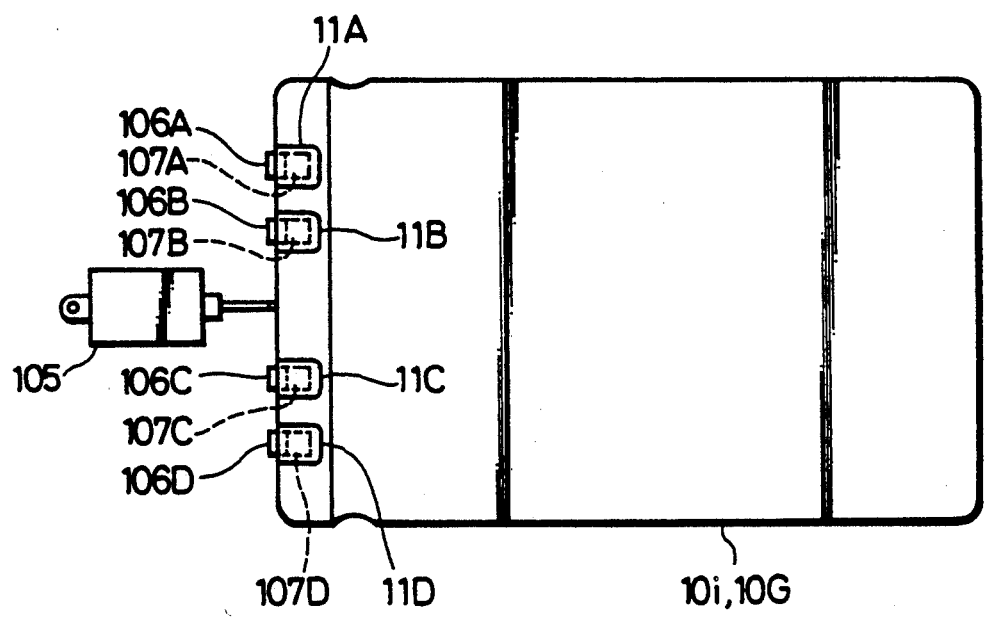
FIG. 7A is a front elevational view showing an arrangement of sensing devices provided within the radio receiver of FIGS. 1, 2 and 4 for detecting coded information on each of the display card members and thereby identifying a geographic region or a radio band or the like for which each card member is intended.
Figure 7B:
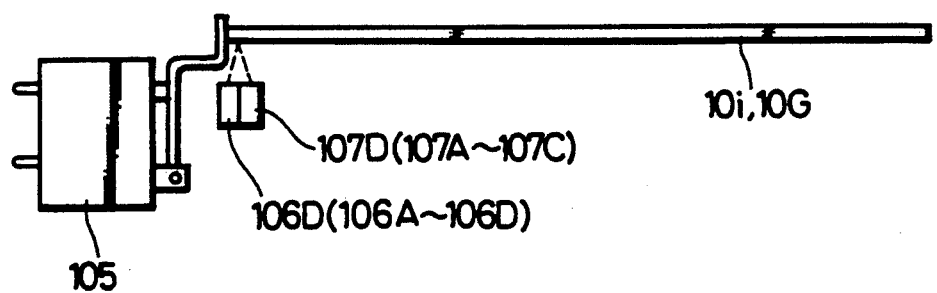
FIG. 7B is a bottom view of the arrangement of sensing devices shown on FIG. 7A.

As shown in FIGS. 7A and 7B, within the receiver casing 100 there is provided a switch 105 having a switch actuator engageable by the leading end edge of a display card member 10i or 10G when the latter is fully inserted through the slot 101 so as to be positioned in back of the window 102. Thus, the switch 105 is adapted to detect the insertion and proper positioning of a card member 10i or 10G. Also suitably positioned within the receiving casing 100 are four sets of light emitting diodes (LEDs) 106A–106D and photo-sensors 107A–107D which are arranged in back of the leading edge portion of the card member 10i or 10G when the latter is fully inserted. More particularly, the LEDs 106A–106D are positioned to direct light against the back surface of the card member 10i or 10G at the locations on the latter occupied by the marks 11A–11D, respectively, while the photosensors 107A–107D are located to receive light reflected from the marks 11A-11D, respectively, and thereby to determine whether such marks 11A-11D are white or black and thus represent the binary coded values [1] or [0], respectively.

Returning to FIG. 1, it will be seen that a card eject button 105A is provided at an end portion of the cassette casing 100 adjacent the slot 101 and may be manually depressed for suitably ejecting a card 10i or 10G through the slot 101 from the interior of the casing 100. Further, a liquid crystal display (LCD) 106 is provided above the transparent window 102 and is operative, for example, as shown on FIG. 2, to digitally display the receiving frequency, that is, the frequency to which the synthesizer-type radio receiver is tuned. A power switch 107 is also provided above the window 102 next to the LCD 106, and a suitable speaker may be provided behind a perforated or otherwise sound pervious portion 53 of the receiver casing 100.

Figure 8:
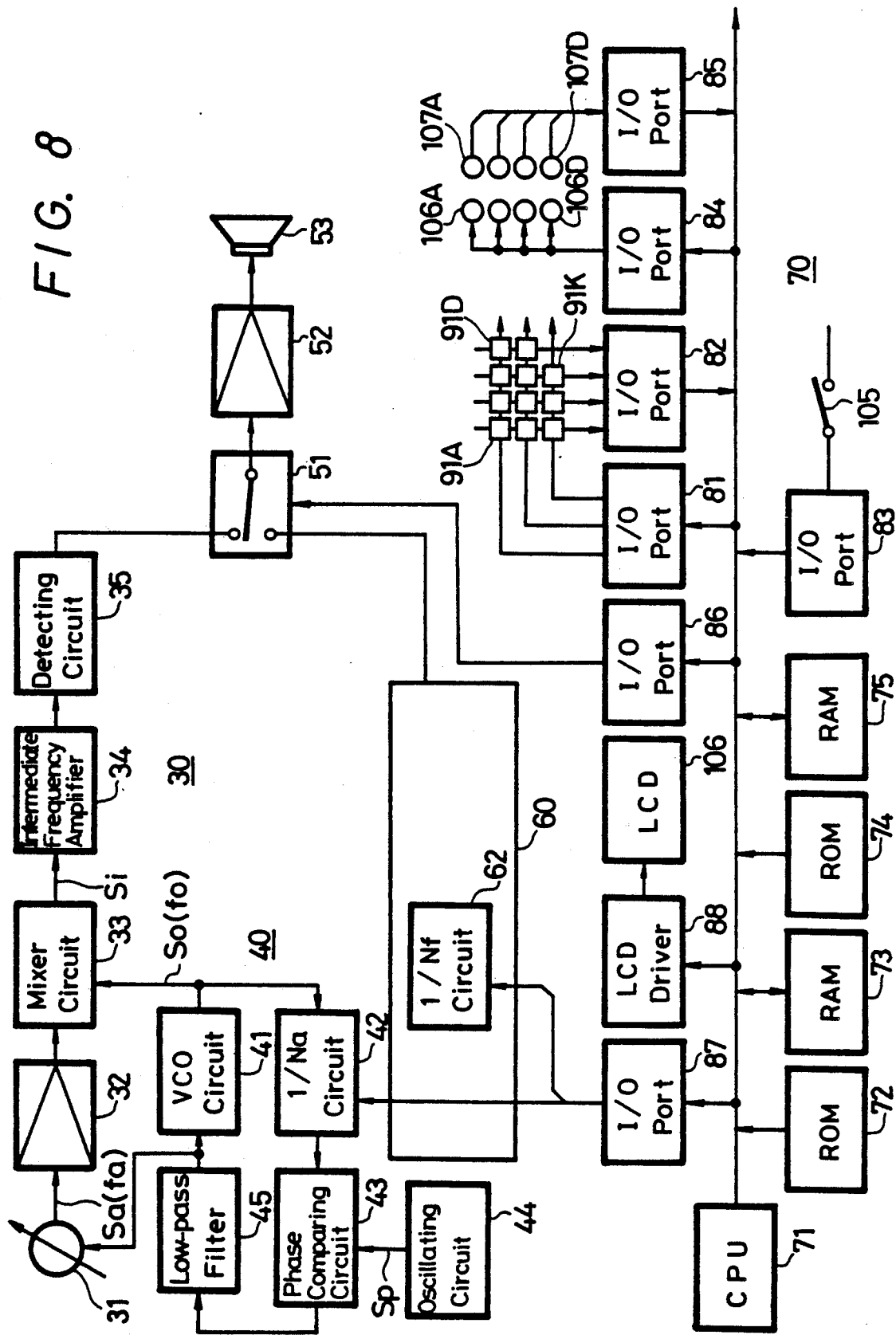
FIG. 8 is a block diagram showing the receiving and control circuits of a synthesizer-type radio receiver according to the embodiment of the invention shown in FIGS. 1,2 and 4.

The receiving and control circuits of the synthesizer-type radio receiver 1 according to an embodiment of the present invention are shown on FIG. 8 to generally comprise an AM receiving circuit 30, a phased-locked loop 40, an FM receiving circuit 60 and a microcomputer 70 which controls the other components of the system and may be, for example, one of the family of microprocessors 1715 available from the NEC Corporation of Japan.

In the AM receiving circuit 30, an AM broadcast signal Sa having a desired frequency fa is derived from an electronic tuning-type antenna tuning circuit 31, and such signal Sa is supplied through a high frequency amplifier 32 to a mixer circuit 33. A voltage controlled oscillator (VCO) 41 included in the phase-locked loop (PLL) 40 provides an oscillation signal $S_o$ having a frequency $f_o$ expressed as follows:

$$f_o = f_a + 450 [\text{kHz}] \tag{I}$$

Such signal $S_o$ is supplied to the mixer circuit 33 as a local oscillation signal so that the mixer circuit 33 is operative to frequency convert the signal Sa to an intermediate frequency signal Si, that is, to a signal having the intermediate frequency of 450 kHz. The intermediate frequency signal Si is supplied through an intermediate frequency amplifier 34 to an AM detecting circuit 35 in which an audio signal is derived or detected. Such audio signal is supplied from detecting circuit 35 through a band switching circuit 51 to a low frequency or audio amplifier 52 which supplies its amplified audio output to a speaker 53 for driving the latter.

The PLL 40 is further shown to include a variable frequency dividing circuit 42 which also receives the signal $S_o$ from the VCO 41 and divides the frequency thereof by the ratio Na. The frequency-divided signal from the circuit 42 is supplied to a phase-comparing circuit 43 for phase comparison in the latter with an oscillation signal Sp having a reference frequency of 9 kHz which is provided by an oscillating circuit 44. The compared output from the phase-comparing circuit 43 is supplied through a low-pass filter 45 to the VCO 41 as a control voltage for the latter. The output of the low-pass filter 45 is also shown to be supplied to the antenna tuning circuit 31 as a channel selecting voltage for the latter.

Accordingly, in the stationary state, the frequency-divided signal from the frequency-dividing circuit 42 and the reference oscillation signal Sp from the oscillating circuit 44 have equal frequencies so that the frequency $f_o$ of the local oscillation signal S from the VCO 41 may be determined as follows:

$$f_o = 9[\text{kHz}] \times Na \tag{II}$$

Figures 12A, 12B, 13:
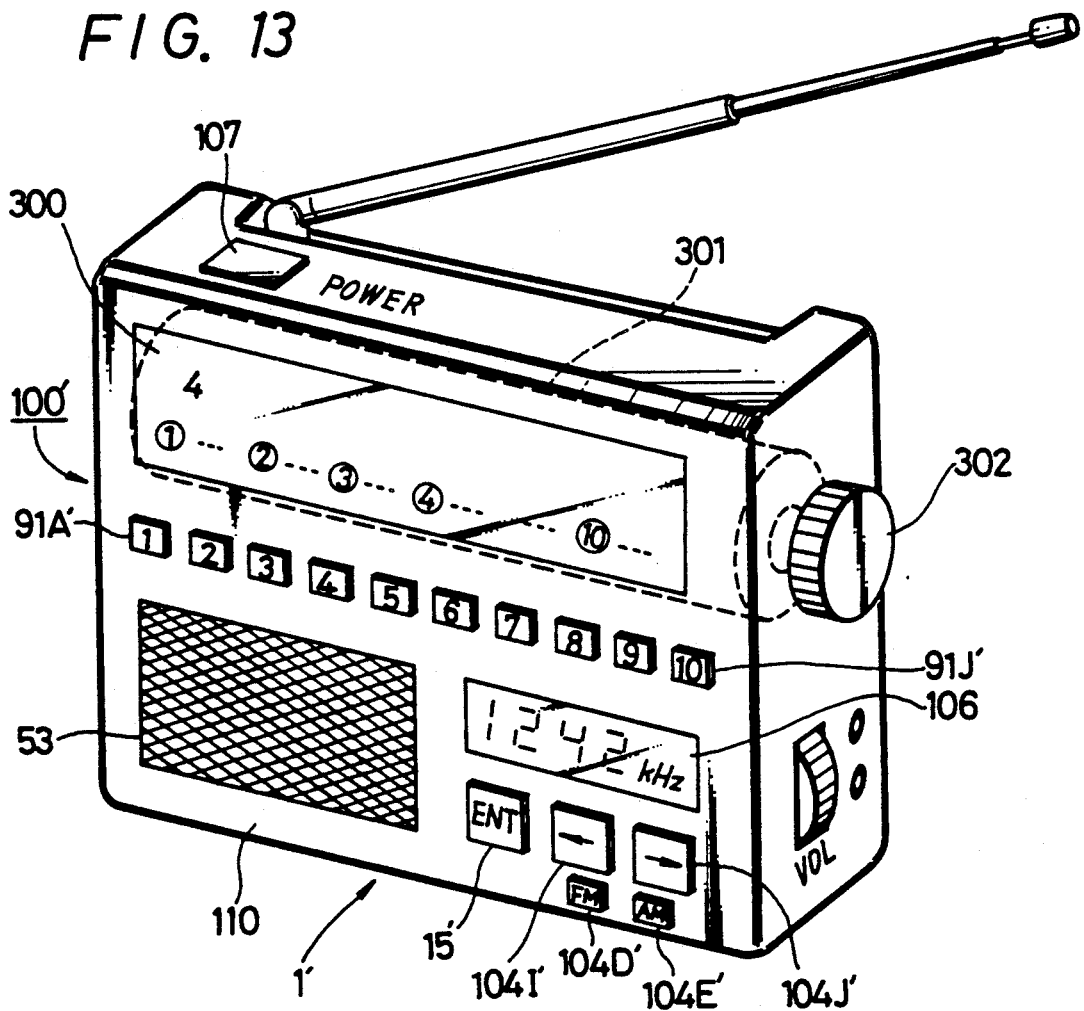
FIGS. 12A and 12B are tables to which reference will be made in explaining how a receiving frequency is changed in accordance with a frequency-dividing ratio and a local oscillation frequency.
FIG.13 is a perspective view similar to that of FIG. 1, but showing a synthesizer-type radio receiver according to another embodiment of the present invention.

Thus, if the frequency-dividing ratio Na is changed by increments of 1 in a range from 109 to 229, as shown in the top row of FIG. 2A, then the local oscillation frequency $f_o$ from the VCO 41 is changed correspondingly in increments of 9 kHz in a range from 981 kHz to 2,061 kHz, as shown in the second row of FIG. 12A. By reason of the foregoing, and as a result of the previously noted equation (I), the receiving frequency $f_a$ is changed in increments of 9 kHz in a range of from 531 kHz to 1,611 kHz, also in response to the unit changes in the frequency-dividing ratio Na, as shown in the third or bottom row of FIG. 12A.

Returning to FIG. 8, it will be understood that the FM receiving circuit 60 is also of a synthesizer-type similar to the AM receiving circuit 30 and, therefore, will not be described in detail other than to indicate that its PLL includes a variable frequency-dividing circuit 62 having a variable frequency-dividing ratio Nf which is changed in increments of 1 in a range from 653 to 793, as shown in the first row of FIG. 12B, and which results in the respective local oscillation frequency $f_o$ changing in increments of 0.1 MHz for each unitary increment of change of the ratio Nf in a range from 65.3 MHz to 79.3 MHz, as shown in the second row of 12B. By reason of the foregoing, and as shown in the third row of FIG. 12B, the FM receiving frequency $f_f$ is changed in increments of 0.1 MHz for each unitary change of the frequency-dividing ratio Nf in a range from 76 MHz to 90 MHz. The FM broadcast audio signal obtained at the output of the FM receiving circuit 60 is also supplied to the band-switching circuit 51 which, upon being changed-over from the position shown on FIG. 8, is operative to supply the FM broadcast audio signal through the amplifier 52 to the speaker 53.

Figure 9A:
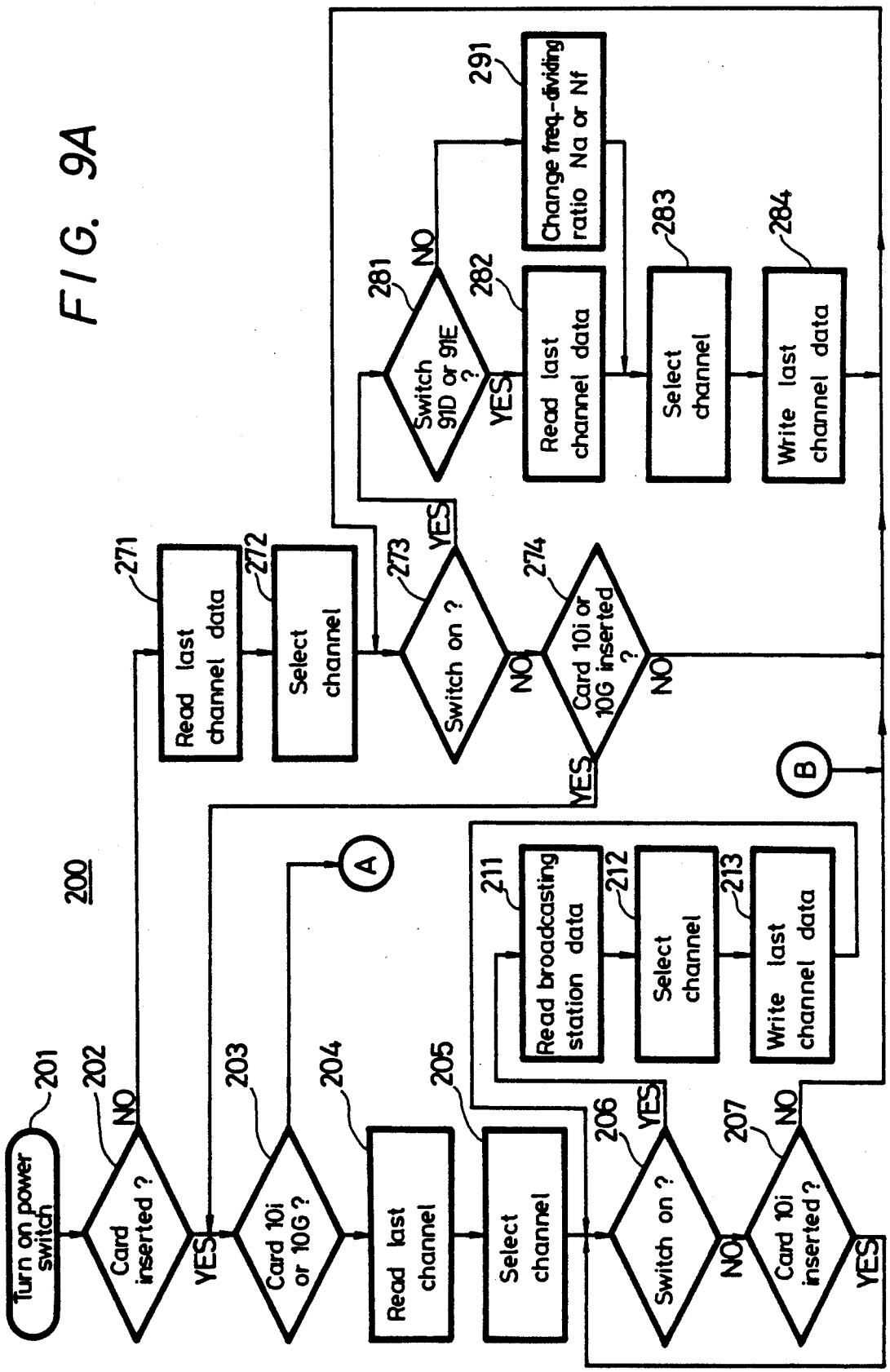
FIGS. 9A and 9B, taken together comprise a flow chart to which reference will be made in explaining the operation of a synthesizer-type radio receiver according to the present invention.
Figure 9B:
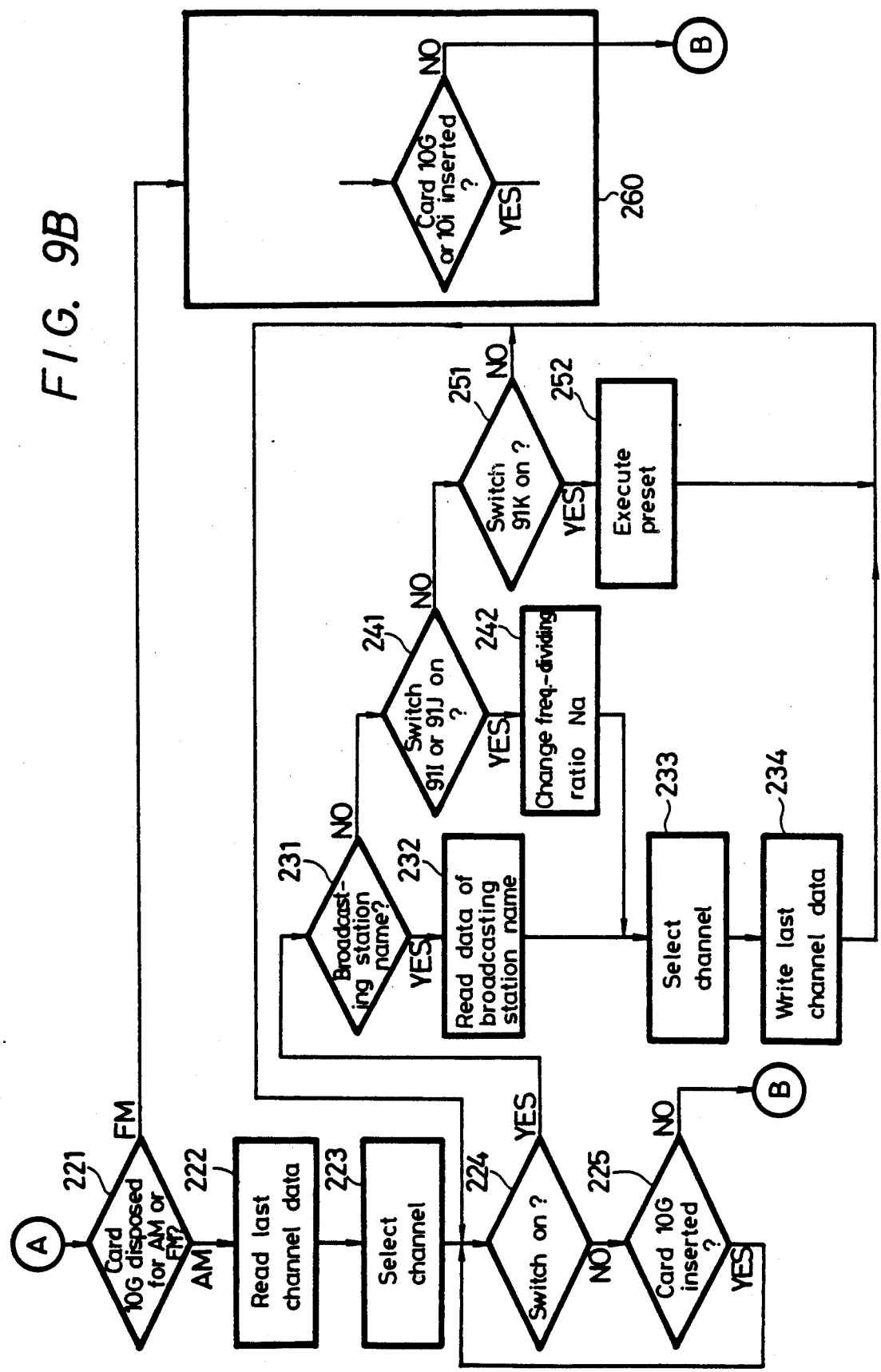

The frequency-dividing ratios Na and Nf are set in the frequency-dividing circuits 42 and 62, respectively, by the microcomputer 70 which is shown to include a 4-bit central processing unit (CPU) 71, a read only memory (ROM) 72 which stores a program hereinafter described with reference to FIGS. 9A and 9B a random access memory (RAM) 73 providing a suitable work area, a ROM 74 in which a data table as is shown in FIG. 10 is written, a RAM 75 which stores last channel data, that is, data corresponding to the frequency received at the time when the power source is turned off, and also frequency data for as many as 14 broadcasting stations that may be preset by the user, input/output (I/O) ports 81-87, and an LCD driver 88 for the LCD 106 which digitally displays the receiving frequency or the like. Such components of the microcomputer 70 identified by the reference numerals 72-75 and 81-88 are connected through a system bus 76 to the CPU 71.

The contents of the data table written in the ROM 74 will now be explained in detail with reference to FIG. 10 in which the addresses of the ROM 74 are simplified in order to provide a better understanding of the invention. In the illustrated example which concerns broadcasting stations in Japan, the entire area of that country is divided into 12 regions, such as, for example, the "HOKKAIDO AREA", the "TOHOKU AREA 1", the "TOHOKU AREA 2" the "KANTO AREA", —the "KYUSHU AREA 2". Indicia 11H to CAH, in which "H" represents the hexadecimal notation, are assigned to the addresses of the ROM 74. At the address 11H of the ROM 74, there is written a frequency-dividing ratio [71H] which indicates the frequency 567 kHz assigned to a first AM broadcasting station that can be received in the first region RGN$_1$, that is, in the HOKKAIDO AREA, and which is identified by the broadcasting station name "NHK SAPPORO RADIO 1". At the address 12H of the ROM 74, there is written a frequency-dividing ratio [73H] which indicates the frequency of 585 kHz assigned to the station known by the name "NHK KUSHIRO RADIO 1", which is a second AM broadcasting station that can be received in the HOKKAIDO AREA. As shown, the frequency-dividing ratio Na for each broadcasting station is written in the ROM 74 at the address m×16+n as the frequency indicating data for the n-th AM broadcasting station that can be received in the m-th region RGNm, with m being any number from 1 to 12 for the case where the territory of Japan is divided into 12 regions, and with n being any number from 1 to 10, in the case where frequency indicating data are to be stored for 10 broadcasting stations that can be received in each region. Although the foregoing refers to the storage in ROM 74 of frequency-dividing ratios for the various AM broadcasting stations that can be received in each of the 12 regions of Japan, it is to be understood that frequency-dividing ratios could be similarly stored or written at respective addresses of the ROM 74 which are assigned to the various FM or short wave broadcasting stations that can be received in each of the several regions.

The RAM 75 is a suitable non-volatile memory which is desirable backed-up by a battery (not shown) so that data stored therein will not be lost when the power switch 107 of the radio receiver is turned off. As shown in FIGS. 11A, 11B and 11C, addresses D1H to E7H, 1H to EH and F1H to F3H, in which "H" again represents hexadecimal notation, are allotted in the RAM 75. The addresses D1H to D7H (FIG. 11A) are accessed for storing frequency-dividing ratios Na1 to Na7, respectively, which are used to receive the broadcast frequencies fa1 to fa7 of first to seventh AM broadcasting stations which the user presets while using the "AM FREE CARD" side of the card member 10G. On the other hand, the addresses E1H to E7H (FIG. 11A) are accessed for storing the frequency-dividing ratios Nf1 to Nf7, respectively, which are used to receive first to seventh FM broadcasting station preset by the user while employing the "FM FREE CARD" side of the card member 10G. For FM broadcasting, the following equations are established:

$$f_0 = 0.1[MHz] + Nf \quad (III)$$

$$f_f = 10.7[MHz] \quad (IV)$$

Continuing with the description of the allocation of the addresses in the RAM 75, it will be seen that the addresses 1H to EH (FIG. 11B) of the RAM 75 are accessed to store the frequency-dividing ratios L1 to L14 of the last channel or broadcasting station to which the receiver 1 is tuned when using one side or the other of the display card members 10A-10F and 10G. The frequency-dividing ratios L1 to L13 may be any of the frequency-dividing ratios Na for the AM broadcasting stations, while the frequency-dividing ratio L14 may be any one of the frequency-dividing ratios Nf for the FM broadcasting stations. The addresses F2H and F3H (FIG. 11C) of the RAM 75, are accessed to store the frequency-dividing ratios La and Lf used for receiving the last AM broadcasting station and the last FM broadcasting station when operating the receiver 1 without any of the display card members 10i and 10G. It will be apparent that the frequency-dividing ratio La may be any of the ratios Na, and that the frequency-dividing ratio Lf may be any one of the ratios Nf. Finally, the address F1H of the RAM 75 is accessed for storing the data AF which identifies whether the last channel or broadcasting station received by the receiver 1 when operated without any one of the display card members 10i and 10G is an AM broadcasting station or a FM braodcasting station.

AS shown in FIG. 8, the pressure-sensitive switches 91A-91K incorporated in the touch panel 103 are connected to the ports 81 and 82 in a matrix fashion, and a so-called dynamic scan is carried out in respect to the pressure-sensitive switches so that data indicating a depressed one of the switches 91A-91K are supplied through the port 82.

The detection switch 105 for detecting the presence of a card member 10pi i or 10G in back of the touch panel 103 is shown on FIG. 8 to be connected to the port 83, while the LEDs 106A-105D and the photo-sensors 107A-107D for reading the coded information 11 on a card 10i or 10G are shown to be connected to the ports 84 and 85, respectively. The port 86 is shown to be connected to the band-switching circuit 51 for applying a bandswitching control signal to the latter, and the port 87 is shown to be connected to the frequency-dividing circuits 42 and 62 for supplying thereto signals determining the frequency-dividing ratios Na and Nf, respectively.

The operation of the synthesizer-type radio receiver 1 embodying the present invention will now be described with reference to the flow chart shown on FIGS. 9A and 9B.

A processing routine 200 of the CPU 71 is initiated with the turning ON of the power switch 107 in the step 201. In the next decision step 202, it is determined, on the basis of the output from the switch 105 to the port 83, whether or not a card 10i or 10G is inserted in the receiver casing 100. If a card 10i or 10G is inserted in the receiver casing 100, as represented by a YES answer at step 202, the routine proceeds to the next decision step 203 in which, on the basis of the coded information 11 on the card which is read by the LEDs 106A-106D and the photosensors 107A-107D, it is determined whether the inserted card member is a card member 10i (that is one of the card members 10A-10F) or the card member 10G.

If the inserted card member is a card member 10i for a particular region, the routine proceeds from step 203 to a step 204 in which the frequency-dividing ratio Lm for the last channel received when using that card member is read out of the address m of the RAM 75, with the number m being determined from the coded information 11 on the respective card member 10i. In the next step 205, the read out frequency-dividing ratio Lm is supplied through the port 87 to the frequency-dividing circuit 42 for establishing or setting such frequency-dividing ratio Lm in the latter. Data indicative of the resulting frequency f$_a$ is formed on the basis of the frequency-dividing ratio Lm and is supplied to the LCD driver 88 so that the receiving frequency f$_a$ is digitally displayed by the LCD 106. Thus, when the power switch 107 is turned ON, the radio receiver 1 is initially made to receive the radio broadcasting station corresponding to the channel or braodcasting station last received when using the display card member 10i inserted through the slot 101 into the receiver casing 100.

Subsequently, the routine proceeds from step 205 to the next decision 206, in which the outputs of the pressure-sensitive switches 91A-91J are checked. If none of the pressure-sensitive switched 91A-91J is depressed, as represented by a NO answer at step 206, the routine proceeds to the next decision step 207 in which it is determined whether or not a card member 10i corresponding to a respective region, that is, one of the cards 10A-10F, is still inserted in the receiver casing 100. If the card member 10i is still present within the receiver casing 100, as represented by a YES answer at the step 207, the routine returns to step 206. Therefore, so long as none of the pressure-sensitive switches 91A-91J is depressed and the card member 10i is not ejected from the receiver casing 100, steps 206 and 207 are repeated and the reception of the radio broadcasting station selected at step 205 is continued.

With the radio receiver 1 in the condition described above, if the user depresses the touch panel 103 at an area of the latter corresponding to the area on the underlying card member 10i where the name of a desired broadcasting station is printed, the corresponding area of the plastic sheet 103D is elastically deformed so that the corresponding, normally spaced apart transparent electrodes 103E and 103F are brought into contact with each other.

For example, if the plastic sheet 103D is depressed at the area thereof corresponding to the area on the card member 10i where the name of the second broadcasting station (n=2) is printed, this results in depression or closing of the second pressure-sensitive switch 91B which is among the switches 91A-91J. The depression of the switch 91B is detected as a YES answer at step 206 from which the routine proceeds to step 211. In step 211, on the basis of the number (n=2) indicated by the depressed switch 91B and the number m indicated by the coded information 11 read from the inserted card 10i, the frequency-dividing ratio Na of the n-th AM broadcasting station which can be received in the m-th region RGNm is read out from the address m×16+n of the ROM 74. In other words, there is read out from the ROM 74, the frequency-dividing ratio stored therein and which is effective to provide the frequency for receiving the broadcasting station whose name is printed on the inserted card member 10i at the area corresponding to the location of the depressed switch 91B.

Then, the routine proceeds to step 212 in which the frequency-dividing ratio Na read out at step 211 is set in the frequency-dividing circuit 42, and data indicative of the frequency fa of the selected AM broadcasting station is supplied to the LCD driver 88 for digital display of such frequency $f_a$ by the LCD 106. Therefore, in response to the depression of a selected one of the switches 91A-91J, the broadcasting station whose name is printed on the respective area of the card member 10i is selected for reception from the time of step 212.

The routine proceeds from step 212 to a step 213 in which the frequency-dividing ratio Na read out of ROM 74 at step 211 is written in the RAM 75 in a corresponding address, for example, the address m corresponding to the region RGNm to which the card member 10i relates (FIG. 11B), and at which the read out ratio Na is written or stored as the frequency-dividing ratio Lm of the last channel for the respective region, whereupon, the routine returns to step 206. Therefore, the condition is continued for receiving the broadcasting station selected by depression of the one of the pressure sensitive switches 91A-91J positionally corresponding to the area on the card member 10i at which the name of such broadcasting station is printed.

If it is determined at decision step 203 that the card member inserted in the slot 101 is the card member 10G which, at its opposite sides, constitutes so-called AM and FM free cards, respectively, the routine proceeds from step 203 to step 221 (FIG. 9B) where it is determined, on the basis of the coded information 11, whether the card member 10G is positioned with its surface constituting an AM free card, or its surface constituting an FM free card facing forwardly in back of the touch panel 103. If the card member 10G is positioned for use as an AM free card, that is, for use in the reception of AM broadcasting stations, the routine proceeds from step 221 to a step 222 in which frequency-dividing ratio L13 is read out from the address DH of the RAM 75 (FIG. 11B). In the next step 223, the frequency-dividing ration L13 is established in the frequency-dividing circuit 42 and the LCD 106 is made to digitally display the corresponding frequency. Thus, when the power switch 107 is turned ON and the card member 10G is inserted into the receiver casing 100 with its surface labeled "AM FREE CARD" facing forwardly or toward the window 102, the receiver 1 is tuned for the reception of the AM broadcasting station that was last received in association with the card member 10G.

The routine proceeds from the step 223 to the next decision step 224 in which the outputs from the pressure-sensitive switches 91A-91G, 91I, 91J and 91K are checked. If none of the switches 91A-91G, 91I, 91J and 91K is depressed, as represented by a NO answer at step 224, the routine proceeds to the next decision step 225 in which it is determined whether or not the card member 10G is still inserted in the receiver casing 100. If the card member 10G is still inserted in the receiver casing 100, as represented by a YES answer at step 225, the routine returns to step 224. Therefore, so long as none of the switches 91A-91G, 91I, 91J and 91K is depressed and the card member 10G is not ejected from the receiver casing, steps 224 and 225 are repeatedly executed, and the broadcasting station selected at step 223 continues to be received.

With the radio receiver 1 in the above described condition, if the touch panel 103 is depressed at an area thereof corresponding to one of the underlying areas 12A to 12G of the card member 10G in which the user has written the name of a desired broadcasting station, for example, if the touch panel 103 is depressed at the portion thereof overlying the area 12B of the card 10G in which the user has written the name of a second (n=2) broadcasting station, this causes depression of the second switch 91B among the pressure-sensitive switches 91A-91G, 91I, 91J and 91K. The depression of the switch 91B is detected at step 224, and the routine then proceeds from step 224 to the next decision step 231 where it is determined whether the depressed switch is one of the switches 91A-91G which, in respect to the card member 10G, correspond to the areas 12A-12G in which the names of respective broadcasting stations may be written by the user. If a YES answer is provided at step 231, the routine proceeds to step 232 in which, on the basis of the number n (=2) indicated by the depressed switch 91B and the number m (=GDH) indicated by the coded information 11 read or detected on the card member 10G, a preset frequency-dividing ratio Nan of the n-th AM broadcasting station whose name has been written in the one of the areas 12A-12G corresponding to the depressed switch is read out of the address DH×16+n of the RAM 75. More specifically, in the example referred to above where the switch 91B is depressed, the frequency-dividing ratio Na2 is read out of the address DH×16+2 of the RAM 75 (FIG. 11A).

The routine then proceeds to step 233 in which the frequency-dividing ratio Nan read out at step 232 is established in the frequency-dividing circuit 42, and data indicative of the corresponding receiving frequency $f_a$ is supplied to the LCD driver 88 so as to cause the LCD 106 to provide a digital display of such frequency. Thus, from the time of the step 233, the radio receiver 1 is arranged for reception of the preset broadcasting station whose name has been written in the one of the areas 12A-12G of the card member 10G underlying the one of the pressure-sensitive switches 91A-91G which has been depressed.

The routine is shown to proceed from step 233 to step 234 in which the frequency-dividing ratio Nan read out at the step 232 and determining the frequency of the broadcasting station which is being received is written in the RAM 75 as the frequency-dividing ratio L13 of the last channel at the address DH corresponding to the card 10G (FIG. 11B). Thereupon, as shown on FIG. 9B, the routine returns to step 224 while the radio receiver 1 continues to receive the broadcasting station selected by the depression of the pressure-sensitive switch 91B or any other one of the switches 91A-91G which correspond to areas 12A-12G of the card member 10G in which the user has written the names of preset broadcasting stations.

If the pressure-sensitive switch which is depressed with the card member 10G inserted in the receiver casing 100 is one of the switches 91I, 91J and 91K, the routine proceeds from step 224 through step 231 to a decision step 241 in which it is determined whether or not one of the switches 91I and 91J has been depressed. If the switch 91I or 91J is depressed, a YES answer is provided at step 241 and the routine proceeds to step 242 in which the present frequency-dividing ratio Na is decremented or incremented by one step in response to each depression of the switch 91A or 91J, respectively, whereupon the routine proceeds from step 242 to the previously described step 243. Therefore, each time the switch 91I or 91J is depressed with the card 10G inserted in the receiver casing, the receiving frequency is decreased or increased, respectively, by one increment. In the case of the illustrated card member 10G, the symbols [−] and [+] are printed on the areas 14I and 14J which are positioned to underlie the pressure-sensitive switches 91I and 91J when the card member 10G is properly inserted in the receiver casing. Thus, each time the touch panel 103 is the area thereof indicated by the symbol [−] or [+], depressed at the area thereof indicated by the symbol [−]or [+] the present receiving frequency is decremented or incremented, respectively, by 9 kHz. In other words, when the card member 10G is inserted into the receiver casing 100, channel or broadcasting station selection can be manually effected by depressing the touch panel 103 at one or the other of the areas indicated by the symbols [−] and [+] printed on the underlying areas 14I and 14J of the card member 10G.

If the pressure-sensitive switch 91K is depressed while the card member 10G is inserted in the receiver casing 100, the routine proceeds from step 224 through steps 231 and 241 to a step 251 in which it is determined whether the switch 91K is depressed or not. If it is determined in step 251, that the switch 91K is depressed, that is, if a YES answer is provided at step 251, then the routine proceeds therefrom to step 252. In such step 252, if the switch 91K is depressed simultaneously with any one of the switches 91A-91G, for example, if the switch 91K is depressed simultaneously with the switch 91B, a frequency-dividing ratio Na2 corresponding to the frequency $f_a$ of the broadcasting station now being received is written in the RAM 75 at its address D2H (FIG. 11A) corresponding to n=2. In other words, presetting of the frequency-dividing ratio Na2 is carried out, and then the routine returns to step 224.

Accordingly, if the touch panel 103 is pressed at any of the portions thereof corresponding to the areas 12A-12G of the inserted card member 10G while, at the same time, the touch panel 103 is pressed at the portion thereof corresponding to the area 15 of the card member 10G on which the legend [MEMORY] is printed, then the frequency-dividing ratio Na determining the present receiving frequency $f_a$ is written in the RAM 75 at the one of the addresses D1H to D7H corresponding to the pressed area, whereby up to seven AM broadcasting stations can be preset in corresponding addresses of the RAM 75 with the names of such preset broadcasting stations being suitably written by the user in the areas 12A-12G on the card member 10G.

If the switch 91H, which does not positionally correspond to any of the areas 12A-12G, 14I, 14J and 15 of the card member 10G, is depressed while the card member 10G is inserted in the receiver casing 100, the routine returns to step 224 from step 251, and the depression of switch 91H is ignored.

If it is determined at decision step 221 that the card member 10G has been inserted through slot 101 into receiver casing 101 with the surface which is visible through the window 102 being the surface printed with the legend "FM FREE CARD" in the area 13, that fact is suitably detected by reading the respective coded information 11 and, in response thereto, the routine proceeds from step 221 to a sub-routine 260 which includes steps similar to the previously described steps 222-252 of the program for presetting the receiver for the reception of selected FM radio broadcasting stations. The sub-routine 60 further executes operations that are similar to those described above with reference to the steps 222-252, so that the steps of the sub-routine 260 need not be described in detail. However, it is to be noted that, in performing sub-routine 260, the addresses EH and E1H-E7H are employed in the RAM 75 in place of the addresses DH and D1H-D7H, respectively. Further, in presetting the receiver 1 for the reception of selected FM broadcasting stations, the equations (III) and (IV) are applied. Moreover, at the time of FM reception, the band-switching circuit 51 is changed-over to a condition opposite that shown on FIG. 8 by a suitable output from the port 86.

If it is determined at step 202 (FIG. 9A) that no card 10i or 10G has been inserted in the slot 101 of the receiver casing 100, then the routine proceeds from step 202 to a step 271 in which data AF, indicating whether the receiver was last tuned to an AM or FM broadcasting station, is read out from the address F1H of the RAM 75 (FIG. 11C). On the basis of such data AF, the frequency-dividing ratio La or Lf for obtaining the frequency of that last received channel is read out from the address F2H or F3H, respectively, of the RAM 75. In the next step 272, the switching circuit 51 is connected to the AM side or the FM side on the basis of the data AF read out in the step 271 and, simultaneously, the frequency-dividing ratio La or Lf is established in the frequency-dividing circuit 42 or 62 in accordance with the data AF and the resulting frequency is digitally displayed by the LCD 106. Thus, when the power switch 107 is turned ON, if a card member 10i or 10G is not, at such time, inserted in the receiver casing 100, then the receiver 1 is made to receive the broadcasting station last received when a card 10i or 10G was inserted in the receiver casing 100.

Subsequently, the routine proceeds from step 272 to a decision step 273 at which it is determined if any of the pressure-sensitive switches 91D, 91E, 91I and 91J is depressed. If it is determined that none of the switches 91D, 91E, 91I and 91J is depressed, as represented by a NO answer at step 273, the routine proceeds to the next decision step 274 at which it is determined whether or not a card member 10i or 10G is inserted in the receiver casing 100. If it is determined that none of the card members 10i and 10G is inserted in the receiver casing 100, as represented by a NO answer at step 274, the routine returns from 274 to step 273. Therefore, so long as none of the switches 91D, 91E, 91I and 91J is depressed and no card member 10i or 10G is inserted in the receiver casing 100, steps 273 and 274 are repeated, and the reception of the broadcasting station selected at step 272 is continued.

With the receiver 1 in the above described condition, if the touch panel 103 is depressed at any one of the areas thereof registering with the areas 104D, 104E, 104I and 104J of the wall surface of the casing 100 visible through the window 102 and at which the characters [FM], [AM] and symbols [−] and [+] are printed, depression of the corresponding one of the pressure-sensitive switches 91D, 91E, 91I and 91J, respectively, is effected. Depression of one of the switches 91D, 91E, 91I and 91J is detected at step 273, and the routine proceeds to the next decision step 281 in which it is determined whether the depressed switch is one of the switches 91D and 91E. If the depressed switch is the switch 91D or the switch 91E, as represented by a YES answer at step 281, the routine proceeds to step 282 in which the data La or Lf is read out from the address F2H or F3H, respectively, of the RAM 75. More specifically, when the touch panel 103 is pressed at the area corresponding to the area 104D having the character [FM] printed thereon, that is, if the switch 91D is depressed at a time when no card member 10i or 10G is disposed in the slot 101, the data Lf corresponding to the last FM broadcasting station received by the receiver 1 is read out from the address F3H of the RAM 75. On the other hand, if it is determined that the switch 91E is depressed, that is, the touch panel 103 has been pressed at the area thereof corresponding to the area 104E (FIG. 2), the data La corresponding to the last AM broadcasting station received by the receiver 1 is read out, in step 282, from the address F2H of the RAM 75. In the next step 283, the switching circuit 51 is connected to the AM side, or to the FM side in dependence upon whether the switch 91E or 91D, respectively, is depressed, and the data La or Lf read from the RAM 75 sets the corresponding frequency-dividing ratio in the circuit 42 or the circuit 62, while the LCD 106 is made to display the receiving band, that is, the AM band or the FM band, and the corresponding receiving frequency.

Then, the routine proceeds to step 284 in which the data AF indicating the present receiving band (AM or FM) is written in the address F1H of the RAM 75, and the present frequency-dividing ratio La or Lf is written in the address F2H or F3H of the RAM 75, whereupon, the routine returns to step 273. Thus, when the touch panel 103 is pressed at the location where the character [FM] or [AM] is printed on the area 104D or 104E, it is possible to condition the radio receiver 1 for receiving FM or AM broadcast signals from the FM or AM broadcasting station that was last received.

If the pressure-sensitive switch 91I or 91J is depressed, as is represented by a YES answer at step 273 and a NO answer at step 281, the routine then proceeds from step 281 to step 291 in which the present frequency-dividing ratio Na or Nf is decremented or incremented, respectively, one step in response to each depression of the switch 91I or 91J. Thereafter, the routine proceeds from step 291 to step 283. Thus, each time the switch 91I or 91J is depressed, the receiving frequency is decremented or incremented by one step. In the described embodiment of the invention, where the symbols [−] and [+] are printed on the areas 104I and 104J corresponding to the locations of the switches 91I and 91J, respectively, each time the symbol [−] or [+] is pressed through the touch panel 103, the present receiving frequency is decremented or incremented, respectively, by one step. Therefore, if no card member 10i or 10G is inserted into the receiver body 100, channel selection can be carried out manually by pressing the touch panel 103 at the locations of the symbol [−] and [+] printed on the areas 104I and 104J.

During broadcast reception with a card member 10i inserted in the receiver casing 100, steps 206 and 207 are repeated. During such repetition of steps 206 and 207, if the eject button 105A is depressed to eject the card member 10i from the receiver casing, such ejection of the card member 10i is sensed by the switch 105 at step 207, whereupon, the routine proceeds from step 207 to step 273 so that, thereafter, the receiving band and the receiving frequency can be changed or selected by the previously described manual operations, that is, by selectively depressing the switches 91D, 91E, 91I and 91J.

During AM broadcast reception with the card member 10G inserted in the receiver casing 100, steps 224 and 225 (FIG. 9B) are repeated. If the card member 10G is ejected from the receiver casing 100, such ejection of the card member 10G is determined at step 225, and the routine proceeds therefrom to step 273 so that manual operation can be similarly effected after the card 10G is ejected. Similar operations are effected in the subroutine 260 which involves FM broadcast reception.

Conversely, if broadcast reception is effected with none of the card members 10i and 10G inserted in the receiver casing 100, steps 273 and 274 are repeated. During such repetition of the steps 273 and 274, if a card member 10i or 10G is inserted into the receiver casing 100, that fact is determined in step 274 and the routine proceeds therefrom to step 203. Thereafter, channel selection is carried out in the manner previously described for the case where the card member 10i or 10G is inserted.

It will be apparent from the foregoing that, generally in accordance with this invention, a card member 10i bearing the name of the region in which the radio receiver 1 is to be operated is inserted into the receiver casing 100, and then the name of the desired broadcasting station printed on the card member 10i is pressed through the touch panel 103 so that, on the basis of the card 10i and the area thereof which is pressed through the touch panel 103, the frequency-dividing ratio Na for receiving the desired broadcasting station is read out from the ROM 74 for providing the desired channel selection. Thus, a desired broadcasting station can be selected without any knowledge, on the part of the user, of the frequencies of the broadcasting stations that can be received in a particular region. Moreover, it is not necessary to previously preset various receiving frequencies so that even those who are unfamiliar with the operation of this type of radio receiver can correctly and easily carry out the channel or broadcasting station selection in a one-touch fashion.

As the transmitting power of broadcasting stations is increased and the efficiency of radio receivers is improved, relatively remote transmissions can be well received, particularly at night, for example, programs broadcast from broadcasting stations in the Osaka region can be well received at night in the Tokyo region. With the radio receiver 1 according to this invention, if the card member 10i provided for the region identified as the [KANSAI AREA] is inserted into the slot 101 of the receiver casing 100 located in Tokyo and then the touch panel 103 is pressed at the area on the card member 10i printed with the name of the desired broadcasting station, it becomes possible to select the desired broadcasting station with ease. In other words, although many distant broadcasting stations can be received at night, the radio receiver 1 according to this invention, greatly facilitates the selection of such distant broadcasting stations for reception without requiring the user to have specific knowledge of the frequencies of such distant stations. Furthermore, there is no need to employ a bulky mechanism, such as, a broadcasting station name drum, so that the radio receiver 1 can be of compact size.

It is also to be noted that the change-over from the reception of AM broadcasting stations to the reception of FM broadcasting stations is effected by means of the card member 10G. In other words, the reception of FM broadcasting stations is achieved when the card member 10G is inserted through the slot 101 in an orientation to make visible, at the window 102, the surface of the card member 10G printed with the legend "FM FREE CARD". On the other hand, AM broadcasting stations are received when the card member 10G is inserted with its surface bearing the legend "AM FREE CARD" visible at the window 102, or when a card member 10i is inserted. Thus, only the power switch 107 of the radio receiver 1 needs to be actuated for initiating its operation, and there is no need to provide a separate band selection switch.

At the present time, the effective range over which FM broadcast signals can be received is relatively small so that many satellite stations are being provided for FM broadcasting. During such time when the employment and locations of FM broadcasting stations is in a transitional state, it is difficult to provide card members for respective geographic regions printed with names of the FM broadcasting stations that can be received in each such region. In other words, it is difficult at the present time to provide cards similar tot he cards 10A-10F naming the FM broadcasting stations that can be received in various respective geographic regions. For that reason, in the described embodiment of the invention, there is provided the so-called "FREE CARD" 10G which, on at least one side, has areas in which the user can write the names of FM broadcasting stations that can be received in the region where the receiver 1 is being used.

Since the cards 10i and 10G are formed by printing suitable symbols and characters on plastic plates or relatively rigid plastic sheet materials, such card members 10i and 10G are obviously very inexpensive when compared with integrated circuit (IC) cards or magnetic cards. Furthermore, the card members 10i and 10G used in accordance with this invention are not influenced by changes in temperature, static electricity, magnetism from speakers or the like so that there is no need to treat the card members 10i and 10G with special care. Moreover, since the opposite sides or surfaces of each of the cards 10i and 10G are assigned to different geographic regions, or to different receiving bands, it is possible to substantially reduce the number of the card members 10i and 10G that are required. Moreover, when no card 10i or 10G is present in the receiver casing 100, the radio receiver embodying this invention can be readily operated manually for the reception of any desired broadcasting station.

Although the operation of the radio receiver embodying this invention has been described for the reception of AM and FM broadcasting stations, the channel selection can be similarly carried out in order to receive shortwave broadcasts, the audio portion or sound of television broadcasts and the like.

Although the coded information 11 is arranged on each card member 10i or 10G in the direction at right angles to the direction of the arrow a on FIGS. 1 and 2 indicating the direction of the insertion of the card member into the casing 100, thereby requiring a number of LEDs 106A-106D and a corresponding number of photo-sensors 107A-107D for detecting the coded information, it will be appreciated that the coded information 11 may be arranged in the direction parallel to the arrow a so that, as the card member 10i or 10G is inserted through the slot 101, a single LED and associated photo-sensor can read or detect the coded information. Moreover, the coded information 11 may be provided on the card member 10i or 10G by means other than the described printing, for example, by cutting suitable openings through the material of the card member to contrast with the opaque material thereof and thereby define a logic "1" or "0.

Furthermore, in the described embodiment of the invention, the data corresponding to the receiving frequencies for AM and FM broadcasting stations that are stored in the ROM 74 and the RAM 75 are respective frequency-dividing ratios Na and Nf, but it is apparent that such data corresponding to the receiving frequencies are not limited to the frequency-dividing ratios, but could have other predetermined relationships to the receiving frequencies. Furthermore, the ROM 74 could be replaced by a non-volatile RAM backed-up by a battery similarly to the RAM 75.

Figure 14:
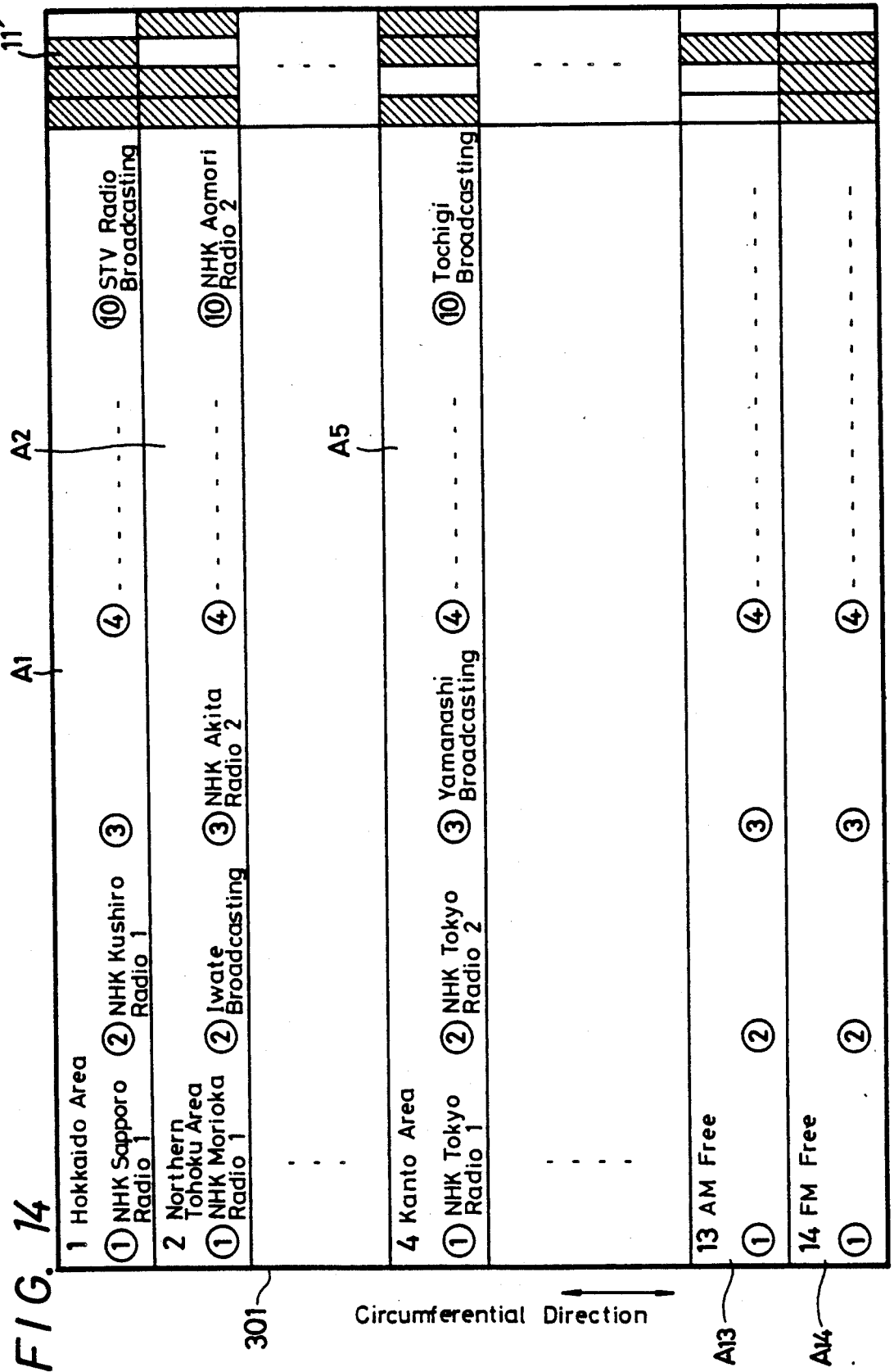
FIG. 14 is a schematic diagram illustrating the peripheral surface of a cylindrical display member included in the receiver of FIG. 13, and which is shown in a developed or flat state.

It is further to be noted, that the present invention is not limited to an arrangement in which the names of various geographic regions and the names of broadcasting stations that can be received in the respective geographic regions are displayed on card members 10i and 10G that can be interchangeably inserted in the receiver casing. For example, in accordance with another embodiment of this invention that will be described in detail with reference to FIGS 13 and 14, the names of a plurality of geographic regions and the names of broadcasting stations that can be received in the respective geographic regions are displayed on circumferentially successive sections of the peripheral surface of a cylindrical display member that may be permanently rotatable within the receiver casing so that the circumferentially successive sections are selectively visible through a suitably disposed transparent elongated window in the receiver casing. In FIGS. 13 and 14, parts corresponding to those described in connection with the first embodiment are identified by the same reference numerals and will not be further described in detail.

More specifically, in the embodiment of FIG. 13, the cabinet or casing 100′ of the radio receiver 1′ is shown to have an elongated rectangular window 300 extending across the upper portion of the front wall 110 of the cabinet. Further, the front wall 110 of the cabinet has channel-selection push buttons 91A′-91J′ projecting therefrom in a row extending laterally under the elongated window 300. The speaker 53 is provided at the left-hand portion of the cabinet wall 110 under the row of push-buttons 91A′-91J′, and the LCD 106 is located at the right hand portion of the wall 110 also under the row of the push buttons 91A′-91J′. A memory key or push button switch 15′, a manually actuable down key or push-button switch 104I′, a manually up key or push-button switch 104J′, a band-switching AM key or push-button switch 104D′ and a band-switching FM key or push-button switch 104E′ are grouped, as shown, under the LCD 106. The channel-selection push-button switches or keys 91A′-91J′ functionally correspond to the pressure-sensitive switches 91A-91J in the first described embodiment, while the memory key or push-button switch 15′ functionally corresponds to the pressure-sensitive switch 91K in the first described embodiment. It will be noted that the channel selection push-button switches or keys 91A′-91J′ are identified by respective numerals [1]-[10] imprinted or etched thereon or on adjacent surface portions of the cabinet wall 110.

Within the cabinet or casing 100′ there is rotatably mounted a cylindrical display member or elongated drum 301 which may be formed of a plastic material, and is located so that its peripheral surface will be visible through the elongated window 300 as the drum 301 is turned about its central axis. A detent mechanism (not shown) is preferably associated with the drum 301 so that the latter will remain in a desired rotated position to which it has been turned by manual actuation of a knob 302 secured to an end of the rotary shaft of the drum 301 outside of the cabinet or casing 100′.

As shown on FIG. 14 which represents the peripheral surface of the drum 301 developed onto a flat plane, the peripheral surface of the drum 301 is divided into circumferentially successive sections $A_1$, $A_2$, $-A_{14}$ which are selectively visible through the elongated window 300 upon selective turning of the drum 301. The sections $A_1$-$A_{12}$ generally correspond to the card members 10i for use in respective geographic regions and that are interchangeably inserted into the receiver casing in the first described embodiment of this invention, while the sections $A_{13}$ and $A_{14}$ of the display drum 301 correspond to the opposite surfaces, respectively, of the card member 10G employed in the first embodiment.

Each of the sections $A_1$-$A_{14}$ of the peripheral surface of the drum 301 has printed thereon, at its left-hand end portion as viewed on FIG. 14, a number 1-14 identifying the respective section and either the name of the geographic region for which the respective section is to be employed, for example, "HOKKAIDO AREA", in the case of the section $A_1$, or the legends "AM FREE" and "FM FREE" in the case of the sections $A_{13}$ and $A_{14}$. Furthermore, each of the sections $A_1$-$A_{12}$ is divided in the direction therealong into areas imprinted with the names of the broadcasting stations that can be received in the respective geographic region. Such areas imprinted with the names of broadcasting stations are further identified by numerals [1]-[10] which correspond to the identifying numerals associated with the channel-selection push button switches 91A′-91J′. The sections $A_{13}$ and $A_{14}$ are similarly divided in the direction therealong into areas identified by the imprinted numerals [1]-[10] which respectively correspond to the identifying numerals associated with the push-button switches 91A′-91J′.

Each of the sections $A_1$-$A_{14}$ is provided with an area, at its right-hand end portion as viewed on FIG. 14, on which there is imprinted coded information 11′ corresponding to the coded information 11 on the card members 10i and 10G in the first embodiment, and similarly identifying the respective sections $A_1$-$A_{14}$. Such coded information 11′ may be read by LEDs and photo-sensors (not shown) which are similar to the LEDs 106A-106D and photo-sensors 107A-107D of the first embodiment for identifying each of the sections $A_1$-$A_{14}$ displayed at the window 300 as the drum or cylinder 301 is manually turned by its knob 302.

Since the drum 301 is not removed from the casing 100′ of the radio receiver 1′, there is no operating state thereof corresponding to that of the first described embodiment in which none of the cards 10i and 10G is inserted. When none of the cards 10i and 10G is inserted into the receiver casing 100 in the first embodiment, the characters or symbols [FM], [AM], [−] and [+] at areas 104D, 104E, 104I and 104J corresponding to the locations of the switches 91D, 91E, 91I and 91J, respectively, are displayed through the transparent touch panel 103 extending across the window 102. In such case, the receiving band is selected by exerting pressure at the area 104D or 104E, and the receiving frequency is manually selected or changed by exerting pressure at the area 104I or 104J for either decrementing or incrementing the receiving frequency.

Furthermore, in the first described embodiment, when the card member 10G is inserted into the casing 100 of the radio receiver 1, the receiving band, that is, AM or FM, is determined by the surface of the card member 10G visible through the window 102 and the symbols [−], [+] and [MEMORY] printed on the card member 10G at the areas 14I, 14J and 15, respectively, are visible through the touch panel 103 and can be pressed for depressing the switches 91I, 91J and 91K, respectively, incorporated in the touch panel. As distinguished from the foregoing, in the embodiment being described with reference to FIGS 13 and 14, the switches 91A′-91J′ for selecting the broadcasting stations named in each of the sections $A_1$-$A_{14}$ are provided separate from the structure of the window 300 through which the sections of the drum 301 may be viewed, and the band-switching switching 104D′ and 104E′ and the manual down and up switches 104I′ and 104J′ are arranged independently near the memory switch 15′. The operation of the radio receiver 1' will now be briefly described.

In order to operate the radio receiver 100', the power switch 107 is turned ON and the drum 301 is turned to a position where a selected one of the sections $A_1$–$A_{12}$, for example, the one of such sections having printed thereon the name of the geographic region in which the radio receiver is located, is displayed through the window 300. Then, the one of the push-buttons 91A'–91J' identified by the number corresponding to the number associated with the name of the desired broadcasting on the displayed one of the sections $A_1$–$A_{12}$ is depressed, whereupon the selected broadcasting station is received. In other words, instead of inserting a selected one of the cards 10i corresponding to the geographic region in which the radio receiver 1' is located, as in the first described embodiment, the drum 301 is turned to a position corresponding to such geographic region. Apart from the foregoing, the operations of the second embodiment of the invention illustrated on FIGS 13 and 14 are substantially similar to the corresponding operations of the first described embodiment.

The radio receiver 1' of FIGS. 13 and 14 is endowed with substantially the same advantages as have been described above with reference to the radio receiver 1. Thus, in the case of the radio receiver 1', since the names of the broadcasting stations that can be received in a particular geographic region are printed on the respective section of the drum 301 displayed at the window 300 when using the radio receiver in that geographic region, it is only necessary to depress the one of the push-buttons 91A'–91J' corresponding to the number associated with the name of the desired broadcasting station, whereupon the frequency-dividing ratio for receiving that desired broadcasting station is read out, for example, from the ROM 74 in the circuit shown on FIG. 8, on the basis of the rotational position of the drum 301, as detected from the coded information 11', and the depressed one of the push-buttons 91A'–91J'. Thus, it is possible to select a desired broadcasting station without any knowledge of the frequencies of the broadcasting stations, and also without presetting the various receiving frequencies. Hence, channel-selection, or the tuning of the radio receiver 1' for the reception of a desired broadcasting station can be carried out accurately and easily in a so-called one-touch fashion, even by those who are unfamiliar with the radio receiver.

Further, particularly at night when broadcasting stations of increased power can be received at large distances from the transmitting antennas, the drum 301 can be rotationally positioned to display a selected one of its sections $A_1$–$A_{12}$ naming a distant geographic region different from the geographic region in which the radio receiver 1' is located. For example, with the radio receiver 1' located in Tokyo, a long-distance broadcasting station located in the Osaka area can be conveniently received by turning the drum 301 to a position in which its section corresponding to the [KANSAI AREA] is displayed at the window 300, and then depressing the one of the push-buttons 91A'–91J' that numerically corresponds to the area of the displayed section of the drum 301 on which the name of the desired broadcasting station in the Osaka area is printed. Thus, once again, particularly at night when long-distance broadcasting stations can be received, the radio receiver 1' can be easily and accurately tuned in a one-touch fashion for the reception of a selected one of the long-distance broadcasting stations.

Moreover, in the case of the radio receiver 1', band switching, for example, between the reception of AM broadcasting stations and FM broadcasting stations, is effected merely in response to the rotary positioning of the drum 301. For example, the reception of AM broadcasting stations is achieved when any one of the sections $A_1$–$A_{13}$ is visible at the window 300, and the reception of FM broadcasting stations is achieved when the section $A_{14}$ is visible at the window 300.

Once again, since the drum 301 is formed by printing on the plastic material of the latter, the names of the various geographic regions and of the broadcasting stations that can be received therein, the drum can be readily and inexpensively produced, as compared with, the cost of IC or magnetic cards. Furthermore, the drum 301, in being printed, need not be protected from the effects of magnetism, for example, the magnetic field of the speaker 53 or the like, whereby there is no need to exercise special care in the handling of the drum 301.

Although the described geographic regions corresponding to the various cards 10i or to the various sections of the drum 301 have all been areas of Japan in the embodiments of the invention described above, such geographic regions could be various European countries, or sections of the United States, and could be provided on display card members 10i or on sections of the drum 301 which, by their coded information 11 or 11' are effective to achieve band-switching for the reception of shortwave radio broadcast.

Having specifically described preferred embodiments of the present invention with reference to the accompanying drawings, it is to be understood that the invention is not limited to those precise embodiments, and that many changes and modifications could be effected therein by one skilled in the art without departing from the spirit or scope of the invention as defined in the appended claims.

What is claimed is:

1. A radio receiver comprising:
    a synthesizer-type receiving circuit including phase-locked loop means having oscillator means for providing an oscillation signal and frequency-dividing means having a variable frequency-dividing ratio for determining the frequency of said oscillation signal, and frequency-converting means for selecting a broadcast signal to be received on the basis of said frequency of the oscillation signal;
    changeable display means having a tabular format for selectively displaying, in respective areas of said tabular format, the names of various geographic regions and the names of respective broadcasting stations that can be received in each of said geographic regions;
    memory means having addresses for storing respective data corresponding to frequencies required for the reception of said broadcasting stations that can be received in said various geographic regions;
    signal forming means operative in cooperation with said changeable display means for providing signals indicative of respective geographic regions whose names are selectively displayed by said display means;
    a plurality of actuable channel-selection switch means each corresponding to a respective area of said tabular format in which said changeable display means displays a name of a broadcasting station that can be received in the respective named geographic region; and control means operative in a channel selection mode to read from said memory means data stored at addresses thereof determined in response to the signal from said signal forming means which is indicative of the geographic region then having its name displayed by said display means and in response to selective actuation of said channel-selection switch means, and including means determining said frequency-dividing ratio in response to said data read from the memory means.

2. A radio receiver further comprising:

a synthesizer-type receiving circuit including phase-locked loop means having oscillator means for providing an oscillation signal and frequency-dividing means having a variable frequency-dividing ratio for determining the frequency of said oscillation signal, and frequency-converting means for selecting a broadcast signal to be received on the basis of said frequency of the oscillation signal;

a casing having a portion with a transparent window and a slot providing access to the interior of said casing in back of said window;

display means including a card member insertable in said casing through said slot and having at least one surface visible through said window and divided into areas of a tabular format on which are imprinted names of a respective geographic region and of broadcasting stations that can be received in the respective geographic region;

memory means having addresses for storing respective data corresponding to frequencies required for the reception of said broadcasting stations that can be received in said various geographic regions;

signal forming means operative in cooperation with said display means for providing signals indicative of respective geographic regions whose names are selectively displayed at said window by said display means;

a plurality of actuable channel-selection switch means each corresponding to a respective area of said tabular format in which said display means displays a name of a broadcasting station that can be received in the respective geographic region; and control means operative in a channel selection mode to read from said memory means data stored at addresses thereof determined in response to said signals indicative of said geographic regions and selective actuation of said channel-selection switch means, and including means determining said frequency-dividing ration in response to said data read from the memory means.

3. A radio receiver according to claim 2; in which said signal forming means includes coded means on said card member for indicating said respective geographic region, and sensing means in said casing for reading said coded means upon the insertion of said card member in said casing and for determining the signal indicative of said respective geographic region named on said one surface in accordance with the read coded means.

4. A radio receiver according to claim 2; in which said card member has another surface at the side thereof opposed to said one surface and being alternatively visible through said window in dependence on which of said one surface and said other surface faces toward said window upon insertion of said card member in said casing through said slot, said other surface of the card member being also divided into said areas of the tabular format on which there are imprinted a name of another geographic region and the names of the broadcasting stations that can be received in said other geographic region.

5. A radio receiver according to claim 4; in which said signal forming means includes coded means on opposed surfaces of said card member for indicating the geographic regions named in respective areas of said one surface and said other surface, and sensing means in said casing for selectively reading said coded means indicating said geographic regions named on said one surface and said other surface upon the selective insertion of said card member in said casing with said one surface and said other surface, respectively, being visible through said window.

6. A radio receiver comprising:

a casing having a portion with a transparent window and a slot providing access to the interior of said casing in back of said window;

a synthesizer-type receiving circuit including phase-locked loop means having oscillator means for providing an oscillation signal and frequency-dividing means having a variable frequency-dividing ratio for determining the frequency of said oscillation signal, frequency-converting means for selecting a broadcast signal to be received on the basis of said frequency of the oscillation signal, an amplitude modulation section and a frequency modulation section, and band-switching means for changing-over between said amplitude and frequency modulation sections;

display means including at least one card member insertable in said casing through said slot and having opposed surfaces selectively visible through said window in dependence on the one of said opposed surface which faces said window upon insertion of the car member in the casing, one of said opposed surfaces of the card member being divided into respective areas of a tabular format on which are imprinted the names of amplitude modulation broadcasting stations that can be received in a respective named geographical region, and the other of said opposed surfaces being divided into respective areas of said tabular format on which are imprinted the names of frequency modulation broadcasting stations that can be received in said named geographical region;

memory means having addresses for storing respective data corresponding to frequencies required for the reception of said broadcasting stations that can be received in said various geographic regions;

signal forming means operative in cooperation with said display means for providing signals indicative of respective geographic regions whose names are selectively displayed by said display means, said signal forming means including coded means on said card member for indicating weather the broadcasting stations named on respective surfaces of said card member are amplitude modulation or frequency modulation stations, and sensing means in said casing for reading said coded means and correspondingly disposing said band-switching means;

a plurality of actuable channel-selection switch means each corresponding to a respective area of said tabular format in which said display means displays a name of a broadcasting station that can be received in the respective geographic region; and control means operative in a channel selection mode to read from said memory means data stored at addresses thereof determined in response to said signals indicative of said geographic regions and selective actuation of said channel-selection switch means, and including means determining said frequency-dividing ratio in response to said data read from the memory means.

7. A radio receiver according to claim 2; in which said display means further includes at least a second card member interchangeable with the first mentioned card member and also having at least one surface divided into said areas of the tabular format and on which are imprinted said names of another respective geographic region and of said broadcasting stations that can be received in said other geographic region.

8. A radio receiver according to claim 7; in which said signal forming means includes coded means on each of said first and second card members, and sensing means in said casing for reading said coded means on the one of said first and second card members which is selectively inserted in said casing, and for determining the signal indicative of the geographic region named on said one card member in accordance with the read coded means.

9. A radio receiver according to claim 1; in which said actuable channel-selection switch means are positionally related to said areas at which said display means display said names of the broadcasting stations that can be received in the respective geographic region.

10. A radio receiver comprising:
a casing having a portion with a transparent window structure and a slot providing access to the interior of said casing in back of said window structure;
a synthesizer-type receiving circuit including phase-locked loop means having oscillator means for providing an oscillation signal and frequency-dividing means having a variable frequency-dividing ratio for determining the frequency of said oscillation signal, and frequency-converting means for selecting a broadcast signal to be received on the basis of said frequency of the oscillation signal;
display means including at least one card member insertable in said casing through said slot and having at least one surface visible through said window structure and divided into areas of a tabular format on which are imprinted names of a respective geographic region and of broadcasting stations that can be received in said respective geographic region;
memory means having addresses for storing respective data corresponding to frequencies required for the reception of said broadcasting stations that can be received in said various geographic regions;
signal forming means operative in cooperation with said display means for providing signals indicative of respective geographic regions whose names are selectively displayed by said display means;
a plurality of actuable channel-selection switch means each corresponding to a respective area of said tabular format in which said display means displays a name of a broadcasting station that can be received in the respective geographic region,
said actuable channel-selection switch means being pressure sensitive and incorporated in said window structure at areas thereof corresponding to the divided areas of said card member imprinted with said names of broadcasting stations so that, upon depressing one of said areas of the window structure, the one of said channel-selection switch means incorporated in said one area of the window structure is actuated; and control means operative in a channel selection mode to read from said memory means data stored at addressed thereof determined in response to said signals indicative of said geographic regions and selective actuation of said channel-selection switch means, and including means determining said frequency-dividing ratio in response to said data read from the memory means for receiving the broadcasting station named at the area of said card member underlying the depressed area of the window structure.

11. A radio receiver according to claim 1; further comprising a casing having a portion with a transparent elongated window; and in which said display means includes a cylindrical display member rotatably in said casing about a central axis parallel to the length of said elongated window so that circumferentially successive sections of the peripheral surface of said display member are visible through said window upon turning of said display member, each of said sections of the peripheral surface having imprinted thereon the name of a respective geographic region and being divided in the direction along the section into areas imprinted with said names of the broadcasting stations that can be received in the respective geographic region.

12. A radio receiver according to claim 11; in which said areas into which each of said sections of the peripheral surface are divided are further identified by respective numerals imprinted thereon, and said channel-selection switch means include push-button switches extending in a row from said casing and being identified by respective numerals corresponding to said numerals imprinted on said areas of each section of the peripheral surface.

13. A radio receiver comprising:
a casing having a portion with a transparent elongated window;
display means including a cylindrical display member rotatably in said casing about a central axis parallel to the length of said elongated window so that circumferentially successive sections of the peripheral surface of said display member are visible through said window upon turning of said display member, each of said sections of the peripheral surface having imprinted thereon the name of a respective geographic region and being divide in the direction along the section into areas imprinted with the names of the broadcasting stations that can be received in the respective geographic region;
a synthesizer-type receiving circuit including phase-locked loop means having oscillator means for providing an oscillation signal and frequency-dividing means having a variable frequency-dividing ratio for determining the frequency of said oscillation signal, and frequency-converting means for selecting a broadcast signal to be received on the basis of said frequency of the oscillation signal;
memory means having addresses for storing respective data corresponding to frequencies required for the reception of said broadcasting stations that can be received in said various geographic regions;

signal forming means operative in cooperation with said display means for providing signals indicative of respective geographic regions whose names are selectively displayed by said display means, said signal forming means including coded means on each of said sections of the peripheral surface for indicating the respective geographic region, and sensing means in said casing for reading said coded means indicating the geographic region named on the section of the peripheral surface then visible through said window and for determining the signal indicative of said geographic region in accordance with the read coded means;

a plurality of actuable channel-selection switch means each corresponding to a respective area of said tabular format in which said display means displays a name of a broadcasting station that can be received in the respective geographic region; and control means operative in a channel selection mode to read from said memory means data stored at addresses thereof determined in response to said signals indicative of said geographic regions and selective actuation of said channel-selection switch means, and including means determining said frequency-dividing ratio in response to said data read from the memory means.

14. A radio receiver comprising:

a casing having a portion with a transparent elongated window;

display means including a cylindrical display member rotatably in said casing about a central axis parallel to the length of said elongated window so that circumferentially successive sections of the peripheral surface of said display member are visible through said window upon turning of said display member, each of said sections of the peripheral surface having imprinted thereon the name of a respective geographic region and being divided in the direction along the section into areas imprinted with the names of the broadcasting stations that can be received in the respective geographic region;

a knob extending from said cylindrical display member to the outside of said casing for manual turning thereof;

a synthesizer-type receiving circuit including phase-locked loop means having oscillator means for providing an oscillation signal and frequency-dividing means having a variable frequency-dividing ration for determining the frequency of said oscillation signal, and frequency-converting means for selecting a broadcast signal to be received on the basis of said frequency of the oscillation signal;

memory means having addresses for storing respective data corresponding to frequencies required for the reception of said broadcasting stations that can be received in said various geographic regions;

signal forming means operative in cooperation with said display means for providing signals indicative of respective geographic regions whose names are selectively displayed by said display means;

a plurality of actuable channel-selection switch means each corresponding to a respective area of said tabular format in which said display means displays a name of a broadcasting station that can be received in the respective geographic region; and control means operative in a channel selection mode to read from said memory means data stored at addresses thereof determined in response to said signals indicative of said geographic regions and selective actuation of said channel-selection switch means, and including means determining said frequency-dividing ration in response to said data read from the memory means.

15. A radio receiver according to claim 1; further comprising a casing; and in which said display means includes a display member removable from said casing, and said control means includes means responsive to the absence of said display member from said casing to cause the reception of a broadcast signal from a broadcasting station to which the receiving circuit was last tuned.

16. A radio receiver comprising:

a casing having a portion with a transparent window structure and a slot providing access to the interior of said casing in back of said window structure;

a synthesizer-type receiving circuit including phase-locked loop means having oscillator means for providing an oscillation signal and frequency-dividing means having a variable frequency-dividing ratio for determining the frequency of said oscillation signal, and frequency-converting means for selecting a broadcast signal to be received on the basis of said frequency of the oscillation signal;

a display member in the form of a card member removably insertable in said casing through said slot and having at least one surface visible through said window structure and divided into areas of a tabular format on which are imprinted names of a respective geographic region and of broadcasting stations that can be received in said respective geographic region memory means having addresses for storing respective data corresponding to frequencies required for the reception of said broadcasting stations that can be received in said various geographic regions;

signal forming means operative in cooperation with said display means for providing signals indicative of respective geographic regions whose names are selectively displayed by said display means;

a plurality of actuable channel-selection switch means which are pressure-sensitive and incorporated in said window structure at areas thereof corresponding to the divided areas of said card member imprinted with said names of broadcasting stations so that, upon depressing one of said areas of the window structure, with said card member positioned in back of the latter, the one of said channel-selection switch means incorporated in said one area of the window structure is selectively actuated; and control means operative, with said card in back of said window structure, to read from said memory means data stored at addresses thereof determined in response to said signals indicative of said geographic regions and the selective actuation of said one channel-selection switch means, and to determine said frequency-dividing ration for receiving the broadcasting station named at the underlying area of said card member, said control means includes means responsive to the absence of said card member from in back of said window structure to cause the reception of a broadcast signal from a broadcasting station to which the receiving circuit was last tuned, and means responsive to the depressing of selected areas of said window structure for actuating respective channel-selection switch means with said card member absent from in back of said window structure so as to incrementally change the frequency to which said receiving circuit is tuned and to store corresponding data in said memory means.

* * * * *